US012557346B2

(12) United States Patent
Singh et al.

(10) Patent No.: US 12,557,346 B2
(45) Date of Patent: Feb. 17, 2026

(54) SOURCE/DRAIN EPITAXIAL LAYER PROFILE

(71) Applicant: Taiwan Semiconductor Manufacturing Co., Ltd., Hsinchu (TW)

(72) Inventors: Gulbagh Singh, Tainan (TW); Hsin-Chi Chen, Tainan (TW); Kun-Tsang Chuang, Miaoli (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/584,282

(22) Filed: Feb. 22, 2024

(65) Prior Publication Data

US 2024/0194784 A1   Jun. 13, 2024

Related U.S. Application Data

(62) Division of application No. 17/815,063, filed on Jul. 26, 2022, now Pat. No. 11,942,547, which is a
(Continued)

(51) Int. Cl.
H10D 30/69 (2025.01)
H01L 21/02 (2006.01)
(Continued)

(52) U.S. Cl.
CPC ..... H10D 30/795 (2025.01); H01L 21/02532 (2013.01); H01L 21/26513 (2013.01); H01L 21/3065 (2013.01); H01L 21/76237 (2013.01)

(58) Field of Classification Search
CPC ......... H01L 21/02532; H01L 21/26513; H01L 21/3065; H01L 21/76237
See application file for complete search history.

(56) References Cited

U.S. PATENT DOCUMENTS 4,636,822 A   1/1987 Codella et al.
7,015,116 B1   3/2006 Lo et al.
(Continued)

OTHER PUBLICATIONS

Tan, Philp Beow Yew, et al., "Measuring STI Stress Effect on CMOS Transistor by Stepping through the Channel Width," 2006 International RF and Microwave Conference Proceedings (Sep. 12-14, 2006), 3 pages.
(Continued)

Primary Examiner — Mark V Prenty
(74) Attorney, Agent, or Firm — Sterne, Kessler, Goldstein & Fox P.L.L.C.

(57) ABSTRACT

The present disclosure describes a method that mitigates the formation of facets in source/drain silicon germanium (SiGe) epitaxial layers. The method includes forming an isolation region around a semiconductor layer and a gate structure partially over the semiconductor layer and the isolation region. Disposing first photoresist structures over the gate structure, a portion of the isolation region, and a portion of the semiconductor layer and doping, with germanium (Ge), exposed portions of the semiconductor layer and exposed portions of the isolation region to form Ge-doped regions that extend from the semiconductor layer to the isolation region. The method further includes disposing second photoresist structures over the isolation region and etching exposed Ge-doped regions in the semiconductor layer to form openings, where the openings include at least one common sidewall with the Ge-doped regions in the isolation region. Finally the method includes growing a SiGe epitaxial stack in the openings.

20 Claims, 21 Drawing Sheets

Related U.S. Application Data division of application No. 17/031,530, filed on Sep. 24, 2020, now Pat. No. 11,462,642, which is a division of application No. 16/117,064, filed on Aug. 30, 2018, now Pat. No. 10,790,391.

(60) Provisional application No. 62/690,648, filed on Jun. 27, 2018.

(51) Int. Cl.
*H01L 21/265* (2006.01)
*H01L 21/3065* (2006.01)
*H01L 21/762* (2006.01)

(56) References Cited

U.S. PATENT DOCUMENTS

| | | | |
|---|---|---|---|
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,324,835 B2 | 4/2016 | Yin et al. | |
| 9,418,897 B1 | 8/2016 | Ching et al. | |
| 9,520,482 B1 | 12/2016 | Chang et al. | |
| 9,576,814 B2 | 2/2017 | Wu et al. | |
| 9,601,594 B2 | 3/2017 | Wu et al. | |
| 9,608,116 B2 | 3/2017 | Ching et al. | |
| 9,812,363 B1 * | 11/2017 | Liao | H10D 84/0151 |
| 9,859,380 B2 | 1/2018 | Lee et al. | |
| 10,522,677 B2 | 12/2019 | Mehrotra et al. | |
| 10,790,391 B2 | 9/2020 | Singh et al. | |
| 11,462,642 B2 | 10/2022 | Singh et al. | |
| 11,942,547 B2 * | 3/2024 | Singh | H01L 21/3065 |
| 2008/0290420 A1 | 11/2008 | Yu et al. | |
| 2013/0313655 A1 | 11/2013 | Wang et al. | |
| 2022/0359751 A1 | 11/2022 | Singh et al. | |

OTHER PUBLICATIONS

Luo, Jie-Xin, et. al., "The Impact of Shallow-Trench-Isolation Mechanical Stress on the Hysteresis Effect of Partially Depleted Silicon-on-Insulator n-Type Metal-Oxide-Semiconductor Field Effects," chin.phys.lett. vol. 31, No. 12 (2014) 126601, 4 pages.

Yang, Wenwei, et al., "Analysis of GIDL Dependence on STI-induced Mechanical Stress," Institute of Microelectronics, Tsinghua University, Beijing, China, (2005), 4 pages.

* cited by examiner

SOURCE/DRAIN EPITAXIAL LAYER PROFILE

CROSS REFERENCE TO RELATED APPLICATION

This application is a divisional application of U.S. patent application Ser. No. 17/815,063, filed on Jul. 26, 2022, titled "Source/Drain Epitaxial Layer Profile," which is a divisional application of U.S. patent application Ser. No. 17/031,530, filed on Sep. 24, 2020, titled "Source/Drain Epitaxial Layer Profile," and issuing as U.S. Pat. No. 11,462,642, which is a divisional of U.S. patent application Ser. No. 16/117,064, filed on Aug. 30, 2018 and titled "Source/Drain Epitaxial Layer Profile," and issuing as U.S. Pat. No. 10,790,391, which claims the benefit of U.S. Provisional Patent Application No. 62/690,648, filed on Jun. 27, 2018 and titled "Source/Drain Epitaxial Layer Profile." The aforementioned applications are incorporated by reference herein in their entireties.

BACKGROUND

Silicon germanium epitaxial layers formed on source/drain terminals of a fin field effect transistor (FINFET) or a planar FET can develop a faceted profile when grown between an active semiconductor region and a dielectric isolation region. As a result of the silicon germanium faceted profile, contact formation on the epitaxial layers can be challenging.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
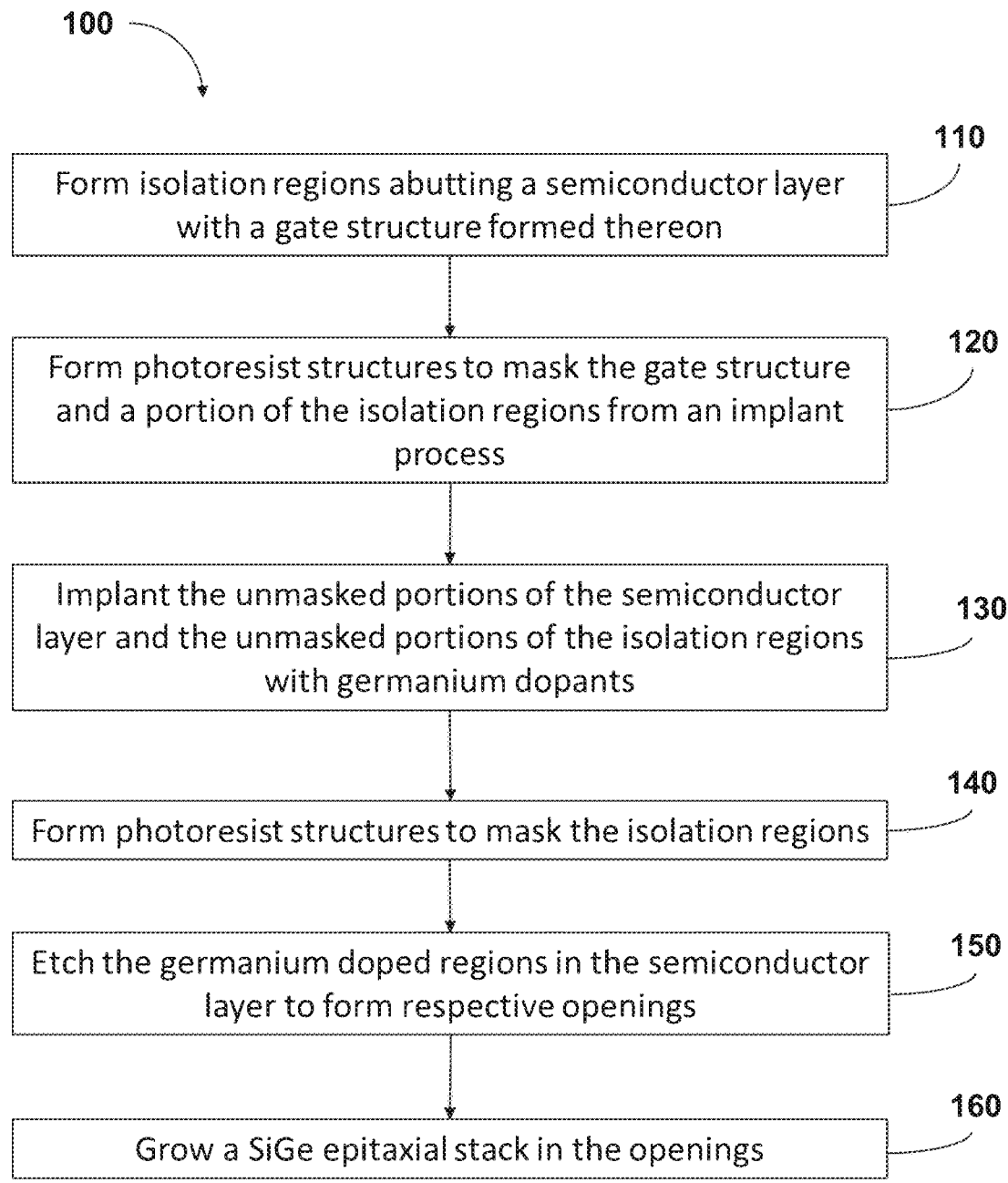
FIG. 1 is a flow diagram of an exemplary fabrication method for the formation of a silicon germanium nanostructure in an isolation region, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "substantially" as used herein indicates the value of a given quantity that can vary based on a particular technology node associated with the subject semiconductor device. Based on the particular technology node, the term "substantially" can indicate a value of a given quantity that varies within, for example, ±5% of a target (or intended) value.

The term "about" as used herein indicates the value of a given quantity that can vary based on a particular technology node associated with the subject semiconductor device. Based on the particular technology node, the term "about" can indicate a value of a given quantity that varies within, for example, 5-30% of the value (e.g., ±5%, ±10%, ±20%, or ±30% of the value).

The term "vertical," as used herein, means nominally perpendicular to the surface of a substrate.

The term "horizontal," as used herein, means nominally parallel to the top surface of a substrate.

The term "dielectric layer" or "dielectric material", as used herein, refers to a layer or a material that functions as an electrical insulator.

In integrated circuit (IC) fabrication, the source and drain regions of the field effect transistors (FETs) include one or more epitaxial layers grown on a portion of a semiconductor area. N-type FETs (NFETs) and p-type FETs (PFETs) can have different epitaxial layers in their source/drain regions. For example, PFETs can include source/drain regions with silicon germanium (SiGe) epitaxial layers, while NFETs can include source/drain regions with epitaxial layers having n-type dopants and carbon co-dopants.

To promote a defect-free growth of the epitaxial source/drain layers on an underlying semiconductor surface, the epitaxial layer and the underlying semiconductor material need to have similar or comparable lattice constants (e.g., within a fraction of an angstrom or less). Since germanium (Ge) has a larger lattice constant than silicon (Si) (e.g., 5.66 Å for Ge as compared to 5.34 Å for Si), SiGe will have a lattice constant that is larger than that of Si and smaller than that of Ge. For example, depending on the concentration of Ge in the SiGe matrix, the lattice constant for SiGe can range from about 5.5 Å to about 5.6 Å.

The growth behavior of epitaxial layers on dielectric materials, which can have either a polycrystalline or an amorphous microstructure, can also be challenging due to a lattice constant mismatch between the epitaxial material (e.g., SiGe) and the amorphous or polycrystalline material (e.g., silicon oxide, silicon nitride, silicon oxy-nitride, etc.). This is because amorphous or polycrystalline materials do not have a lattice constant. For example, amorphous or polycrystalline materials do not have a lattice or "long range" crystalline order like crystalline materials.

The semiconductor areas in an IC are electrically isolated via isolation areas or regions filled with an amorphous dielectric material, such as silicon oxide. Some source/drain regions can be formed on an area of the semiconductor structure that borders with an isolation region. In these areas, a SiGe source/drain epitaxial layer can come in contact with a portion of the isolation region during growth. As such, the SiGe epitaxial layer grows on two surfaces with different respective microstructures—a crystalline surface (semiconductor area) and an amorphous surface (isolation region). As a result of this mismatch, the SiGe layer can develop one or more facets at the dielectric interface that can suppress the growth of the SiGe layer in certain crystallographic directions. As a result of the facet formation, the SiGe layer can grow thinner in the vicinity of the isolation region and thicker away from the isolation region. In other words, the thickness of the SiGe epitaxial layer across the source/drain region can vary.

Further, the SiGe epitaxial layer can develop a "sloped" top surface due to the facet formation. The facet formation is random and can consequently lead to a SiGe thickness non-uniformity across the wafer. This in turn can narrow the etching process window for contact openings subsequently formed on the SiGe epitaxial layers. For timed etching processes, the depth of the contact openings may vary substantially for SiGe epitaxial layers with different thicknesses and top surface slopes. Consequently, some contact openings will reach the SiGe top surface, while others will not.

The present disclosure is directed to a method that mitigates, or eliminates, the formation of facets during the SiGe epitaxial layer growth. This in turn produces SiGe epitaxial layers that are more uniform and have a horizontal top surface across the source/drain region. In some embodiments, this can be accomplished by forming a SiGe nanostructure at the interface of the semiconductor/isolation region. The SiGe nanostructure can be interposed between the grown SiGe epitaxial layer and the dielectric material in the isolation region. In some embodiments, the SiGe nanostructure can be used as a growth surface with reduced lattice mismatch for the SiGe epitaxial layers. In some embodiments, the Ge implant dose can range from about $1 \times 10^{16}$ atoms/cm$^2$ to about $1 \times 10^{18}$ atoms/cm$^2$ and the resulting Ge implanted area can have a width between about 5 nm and about 25 nm.

FIG. 1 is a flow chart of an exemplary fabrication method 100 that describes the formation of a SiGe nanostructure between a SiGe source/drain region and an isolation region. In some embodiments, the SiGe nanostructure is formed in a portion of the isolation region to promote the formation of SiGe epitaxial layer with a substantial horizontal top surface and uniform thickness. In some embodiments, the SiGe nanostructure is formed by doping a selected area of the isolation region adjacent to the semiconductor layer with Ge dopants. This disclosure is not limited to this operational description. Other operations are within the spirit and scope of the present disclosure. It is to be appreciated that additional operations may be performed. Moreover, not all operations may be needed to perform the disclosure provided herein. Additionally, some of the operations may be performed simultaneously, or in a different order than shown in FIG. 1. In some implementations, one or more other operations may be performed in addition to or in place of the presently described operations. For illustrative purposes, fabrication method 100 is described with reference to the embodiments shown in FIGS. 2 through 11.

Figure 2:
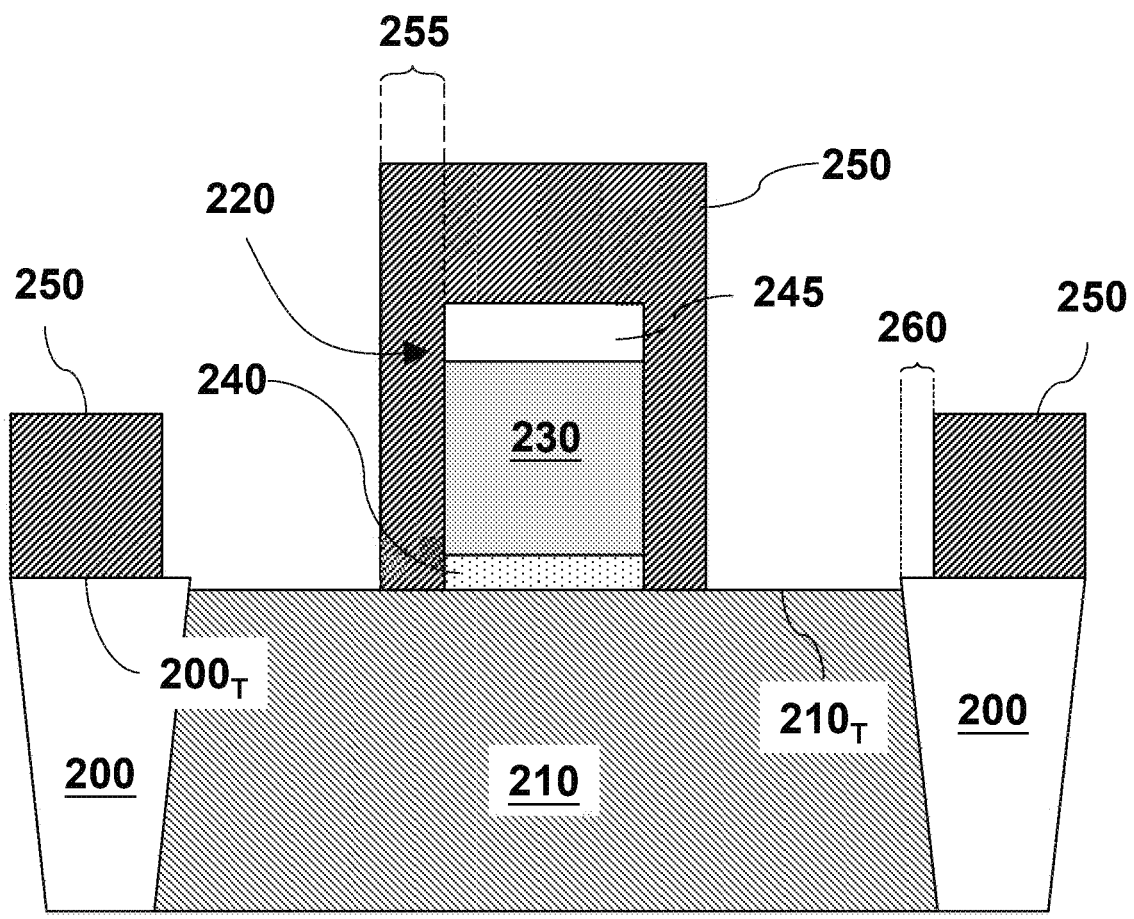
FIG. 2 is a cross-sectional view of a structure with a semiconductor layer surrounded by isolation regions after the formation of photoresist structures, in accordance with some embodiments.

Fabrication method 100 begins with operation 110, where isolation regions can be formed abutting a semiconductor layer with a gate structure formed thereon. By way of example and not limitation, FIG. 2 is a cross sectional view of isolation regions 200 abutting a semiconductor layer 210 with a gate structure 220 formed on semiconductor layer 210. In some embodiments, isolation regions 200 can be, for example, shallow trench isolation (STI) regions filled with an amorphous dielectric material, such as silicon oxide ($SiO_x$). Semiconductor layer 210 can be an oxide defined (OD) region—for example, a semiconductor structure surrounded ("defined") by isolation regions 200. In some embodiments, top surfaces $200_T$ of isolation regions 200 are not coplanar with top surface $210_T$ of semiconductor layer 210. For example, top surface $210_T$ can be below the level of top surface $200_T$, as shown in FIG. 2. However, this is not limiting, and top surfaces $200_T$ and $210_T$ can be coplanar. Further, top surfaces $200_T$ and $210_T$ are horizontal surfaces, e.g., nominally parallel to the x-y plane and nominally parallel to a top surface of a substrate (not shown in FIG. 2).

Semiconductor layer 210 can be an active region on which one or more FETs can be formed. For example, semiconductor layer 210 can be doped, un-doped, or include one or more doped regions. By way of example and not limitation, semiconductor layer 210 can be a semiconductor fin on which one or more FETs can be formed. In some embodiments, semiconductor layer 210 can include (i) silicon, (ii) a compound semiconductor such as gallium arsenide (GaAs), gallium phosphide (GaP), indium phosphide (InP), indium arsenide (InAs), and/or indium antimonide (InSb), silicon germanium (SiGe), (iii) an alloy semiconductor including, gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP), or (iv) combinations thereof.

For example purposes, semiconductor layer 210 and isolation regions 200 in fabrication method 100 will be described in the context of a crystalline silicon layer and amorphous silicon oxide, respectively. Based on the disclosure herein, other materials, as discussed above, can be used. These materials are within the spirit and scope of this disclosure.

In some embodiments, gate structure 220 is a sacrificial gate structure that can be replaced with a metal gate structure in a subsequent operation. Gate structure 220 can include a gate electrode 230 and gate dielectric 240. In some embodiments, gate electrode 230 includes polycrystalline silicon ("poly") and gate dielectric 240 includes a dielectric, such as silicon oxide grown directly over semiconductor layer 210. Further, gate electrode 230 of gate structure 220 can be capped (e.g., covered) with a hard mask layer 245, as shown in FIG. 1. In some embodiments, hard mask layer 245 is an oxide (e.g., silicon oxide), a nitride (e.g., silicon nitride), or a stack that includes an oxide and a nitride. In some embodiments, hard mask layer 245 protects gate structure 220 from a subsequent etching process.

In operation 120 of fabrication method 100, photoresist structures can be formed to mask the gate structure and a portion of the isolation regions from an implant operation. By way of example and not limitation, the photoresist structures can be formed by patterning a photoresist layer disposed over the structure. As shown in FIG. 2, photoresist structures 250 mask (e.g., cover) gate structure 220 and partially mask isolation regions 200. In other words, photoresist structures 250 partially overlap with top surface $200_T$ of isolation region 200 so that exposed portions of isolation regions 200 with a width 260 are formed. According to some embodiments, width 260 can range from about 5 nm to about 25 nm (e.g., from about 5 nm to about 10 nm, from about 8 nm to about 15 nm, from about 12 nm to about 20 nm, from about 18 nm to about 25 nm, etc.). In some embodiments, width 260 defines the width of a Ge-doped region that will be formed in isolation region 200 in a subsequent operation of fabrication method 100. As shown in FIG. 2, the exposed portions of isolation regions 200 are immediately adjacent to semiconductor layer 210. In some embodiments, the width of photoresist structure 250 over gate structure 220 is larger than the width of gate structure 220, as shown in FIG. 2. For example, each side of the photoresist structure 250 extends beyond the edges of gate structure 220 by an overlay width 255. Since each photoresist structure 250 is an implant mask, the width of each photoresist structure 250 can define the areas of semiconductor layer 210 and isolation regions 200 that can be implanted with Ge dopants.

Figure 3:
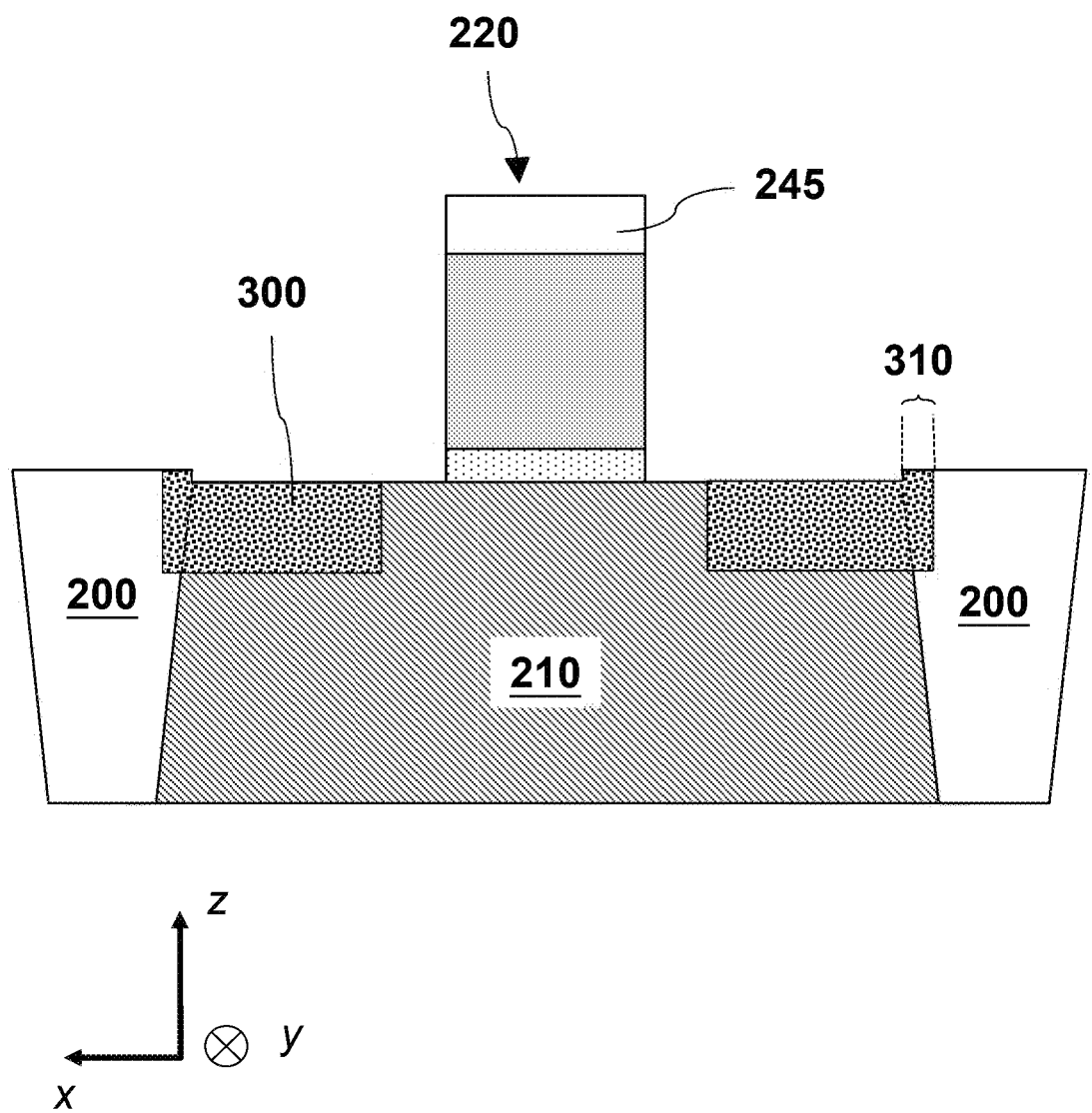
FIG. 3 is a cross-sectional view of a structure with a semiconductor layer surrounded by isolation regions after the formation of a shared germanium doped region between the semiconductor layer and the isolation regions, in accordance with some embodiments.
Figure 4:
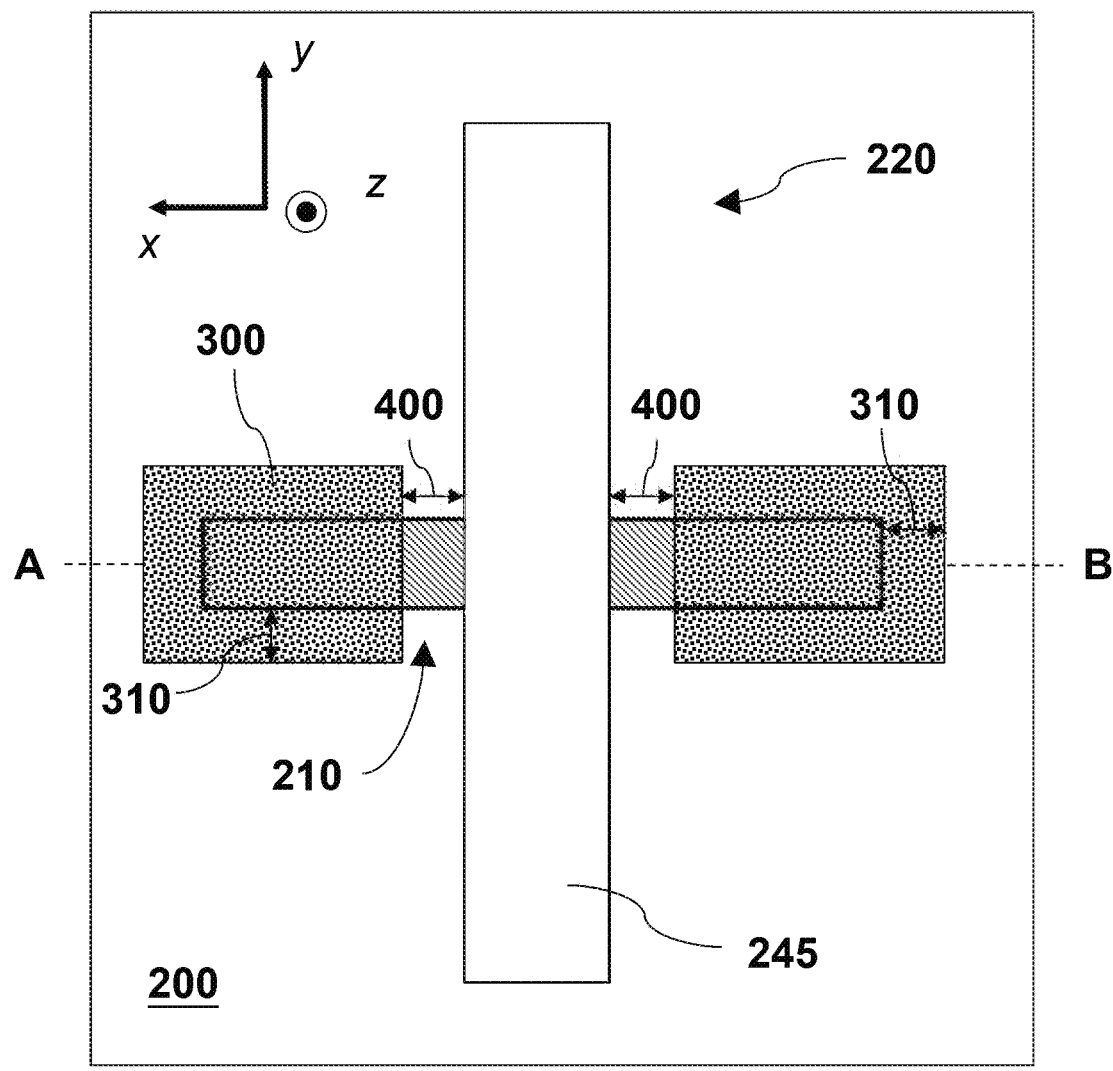
FIG. 4 is a top-view of a structure with a semiconductor layer surrounded by an isolation region after the formation of a shared germanium doped region between the semiconductor layer and the isolation regions, in accordance with some embodiments.

Referring to FIG. 1, fabrication method 100 continues with operation 130, where the unmasked, or exposed, portions of semiconductor layer 210 and isolation regions 200 are implanted with Ge dopants. A purpose of operation 130 is to form Ge-doped regions in the semiconductor layer that extend from the semiconductor layer to a portion of the isolation region. For example, FIG. 3 shows Ge-doped regions 300 formed in semiconductor layer 210 and isolation regions 200 after the implant process of operation 130. In the example of FIG. 3, photoresist structures 250 have been removed with an etching process (e.g., wet etching process). FIG. 4 is a top view of the structure depicted in FIG. 3. In some embodiments, FIG. 3 is a cross-sectional view of FIG. 4 along dotted line AB. As shown in FIG. 4, gate structure 220 may extend over isolation region 200 in the y-direction. Further, isolation region 200 surrounds semiconductor layer 210 in the x-y plane. It is noted that the dimensions and relative position of gate structure 220 and semiconductor layer 210 are not limited to the example of FIG. 4. Therefore, alternative dimensions and placement of gate structure 220 and semiconductor layer 210 are possible. Further, multiple gate structures and semiconductor layers are possible.

In some embodiments, the implant dose during the implant process of operation 130 can range from about $1\times10^{16}$ ions/cm$^2$ to about $1\times10^{18}$ ions/cm$^2$. An optional rapid thermal annealing process or another thermal treatment at a temperature between about 600° C. and about 1100° C. can "activate" the Ge dopants (e.g., allow the Ge dopants to diffuse and chemically bond with the silicon atoms). Referring to FIGS. 3 and 4, doped region 300 can extend from the edges of semiconductor layer 210 into isolation region 200 from about 5 nm to about 25 nm. In other words, Ge-doped regions 300 can extend into isolation region 200 by a width 310 that is substantially equal or greater than width 260 of FIG. 2. This is because the Ge dopants can diffuse into isolation region 200 from their implanted position during the annealing process. Therefore, width 310 can be equal or greater than width 260, according to some embodiments. Further, width 310 may depend on width 260, the implant conditions (e.g., implant direction and implant energy), and the annealing conditions of the dopant activation process (e.g., annealing temperature and duration).

In some embodiments, thermal activation of the Ge dopants at temperatures between about 600° C. and 1100° C. results in the formation of SiGe and Ge "nanostructures" in isolation regions 200. For example, a SiGe crystalline nanostructure can be formed when Ge dopants diffuse and bond with silicon atoms in isolation regions 200. In some embodiments, the SiGe nanostructures include oxygen atoms. The formed SiGe and Ge nanostructures may have a lattice constant that is closer matched to the lattice constant of epitaxially grown SiGe and Ge layers (e.g., between about 5.5 Å and about 5.66 Å), however their exact lattice constant value within isolation regions 200 can be difficult to predict.

According to some embodiments, width 310 can range from about 5 nm to about 25 nm. In some embodiments, for widths 310 that are narrower than about 5 nm, a SiGe microstructure may not be formed due to the limited availability of Ge-dopants and silicon atoms or the formed SiGe/Ge nanostructures may not be large enough to provide a growth surface for the epitaxial SiGe layers. On the other hand, for widths 310 that are larger than about 25 nm, the formed SiGe microstructure can be detrimental to the dielectric properties of isolation regions 200 and cause electrical shorts between adjacent semiconductor layers 210—for example, when a pitch between semiconductor layers 210 is comparable to width 310 (e.g., between about 30 and about 35 nm).

In some embodiments, and referring to FIG. 4, the placement of Ge-doped region 300 is such that a distance 400 between gate structure 220 and Ge-doped region 300 is maintained at about 40 nm or greater (e.g., ≥40 nm). This is to prevent leakage current between a channel region (not shown in FIG. 4) formed in semiconductor layer 210 (e.g., below gate structure 220) and the Ge-doped region 300. In some embodiments, distance 400 is controlled through overlay width 255 between photoresist structure 250 and gate structure 220, as shown in FIG. 2. In some embodiments, distance 400 is equal to the total thickness of spacers 600 on the sidewalls of gate structure 220.

Figure 5:
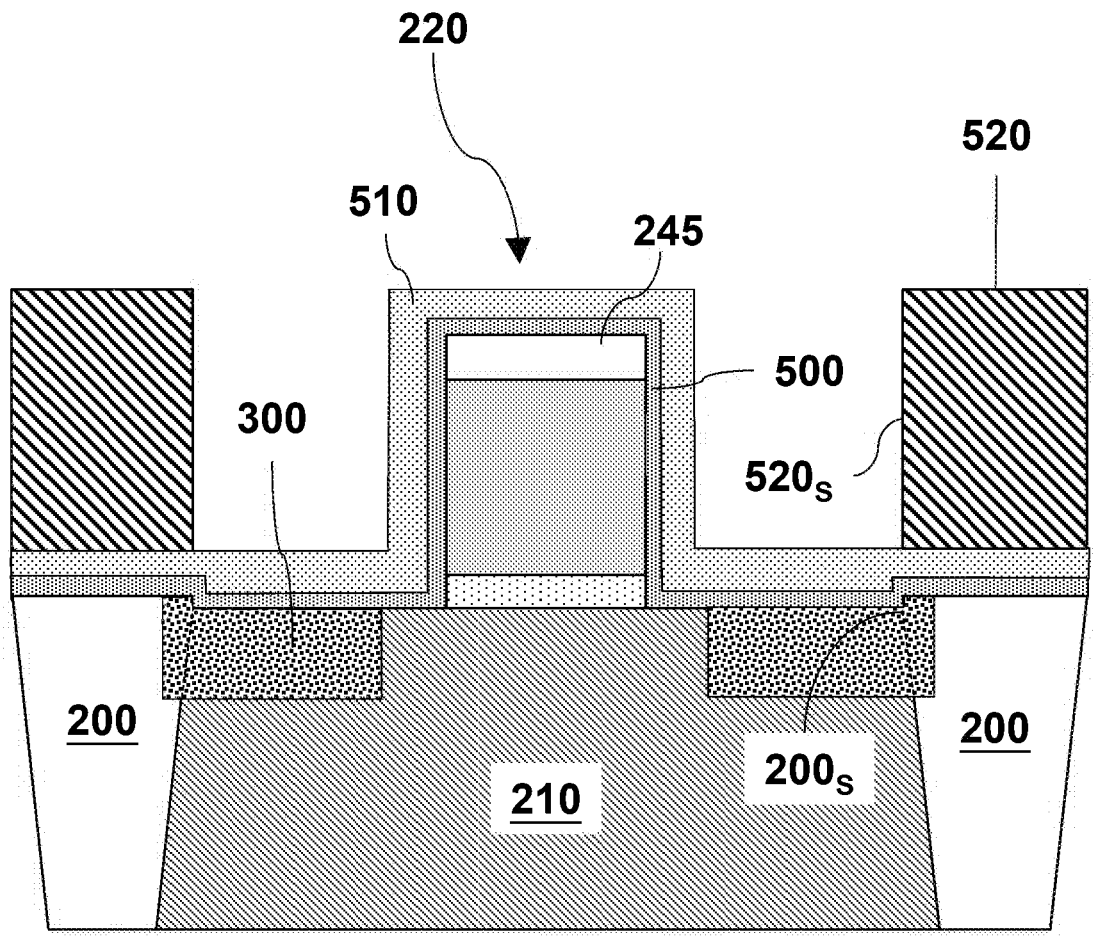
FIG. 5 is a cross-sectional view of a structure with a semiconductor layer surrounded by isolation regions after a conformal deposition of an oxide and a nitride layer, in accordance with some embodiments.

In referring to FIG. 5, an oxide layer 500 and a nitride layer 510 can be conformally deposited over gate structure 220, semiconductor layer 210, and isolation regions 200. By way of example and not limitation, oxide layer 500 can include silicon oxide ($SiO_x$) deposited from tetraethyl orthosilicate (TEOS), and nitride layer 510 can include silicon nitride ($SiN_x$).

In referring to FIG. 1 and operation 140, photoresist structures can be formed to mask isolation regions 200 in preparation for a subsequent etching operation. In some embodiments, the photoresist structures are etch mask structures that protect the underlying portions of isolation regions 200 from being etched during an etching operation (e.g., dry etching process). Referring to FIG. 5, photoresist structures 520 are formed over isolation regions 200 so that the inner sidewall surfaces $520_S$ of photoresist structures 520 are aligned to the upper sidewall surfaces $200_S$ of the underlying isolation regions 200. Meanwhile, the portions of Ge-doped region 300 within semiconductor layer 210 are not masked by photoresist structures 520 and can be exposed to the etching chemistry of the subsequent etching operation. In some embodiments, photoresist structures 520 are formed by exposing and developing (e.g., patterning) a photoresist layer disposed over gate structure 220, isolation regions 200, and semiconductor layer 210.

Figure 6:
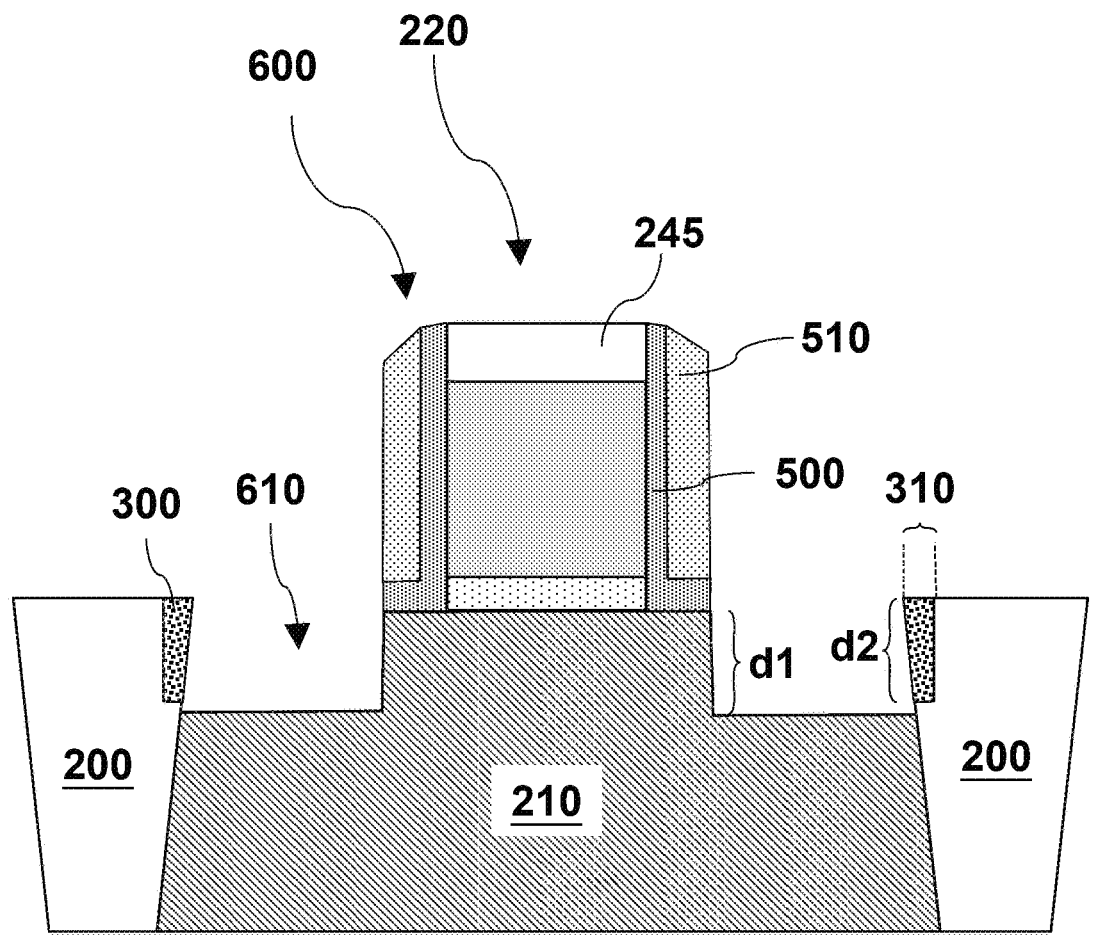
FIG. 6 is a cross-sectional view of a structure with a semiconductor layer surrounded by isolation regions after etching a germanium doped region from the semiconductor region, in accordance with some embodiments.

In referring to FIG. 1 and operation 150 of fabrication method 100, portions of Ge-doped regions 300 in semiconductor layer 210 are etched away to form respective openings in semiconductor layer 210. According to some embodiments, FIG. 6 shows the structure of FIG. 5 after the etching process of operation 150. In some embodiments, the etching process can include multiple etching steps. Further, these etching steps may not be limited to a single etching chemistry. By way of example and not limitation, a first etching step can be configured to preferentially remove nitride layer 510 and oxide layer 500 from the horizontal surfaces of the structure shown in FIG. 5 (e.g., the top surfaces of gate structure 220, semiconductor layer 200, and isolation regions 200). At the same time, the first etching step can partially etch nitride layer 510 and oxide layer 500 from vertical surfaces, such as the sidewalls of gate structure 220. Consequently, spacers 600 are formed on the sidewalls of gate structure 220, as shown in FIG. 6. By way of example and not limitation the first etching step can be an anisotropic dry etching process configured to exhibit directional etching along the z-direction (e.g., perpendicular to the top surface of gate structure 220 and semiconductor layer 210). The first etching step exposes hard mask layer 245 over gate structure 220 and the top surfaces of semiconductor layer 210 and isolation regions 200.

Subsequently, a second etching step can etch away portions of Ge-doped regions 300 in semiconductor layer 200 to form respective openings 610. In some embodiments, the second etching step is an anisotropic dry etching process configured to preferentially etch Ge-doped regions 300 in semiconductor layer 210 over the dielectric material with Ge dopants in isolation regions 200 and nitride layer 510 on the sidewalls of gate structure 220. In some embodiments, the dry etching process can be end-pointed when, for example, Ge-doped regions 300 in semiconductor layer 210 are removed and the underlying substantially "Ge-free" semiconductor layer 210 is exposed. The term "Ge-free" semiconductor layer 210, as used herein, refers to semiconductor layer 210 that is substantially free from Ge-dopants but can be doped with other types of dopants or can be un-doped. In some embodiments, the drying etching process is a timed process or a combination of timed and end-pointed processes. By way of example and not limitation, the etching chemistry can etch Ge-doped semiconductor layer 210 faster than Ge-free semiconductor layer 210. Hence, a slow etching rate during the etching process can signal the removal of doped region 300 from semiconductor layer 210. In some embodiments, the etching process is configured so that depth d1 of opening 610 is equal or greater than depth d2 of SiGe nanostructure (e.g., Ge-doped region 300) in isolation region 200 (e.g., d1≥d2).

In some embodiments, Ge-doped regions 300 in isolation region 200 are not etched (e.g., removed) during operation 150, as shown in FIG. 6. As discussed above, this is because photoresist structures 520 (e.g., shown in FIG. 5) mask (e.g., protect) the Ge-doped regions in isolation structures 200 during the etching process of operation 150, and further because the second etching step of the etching process in operation 150 can be selected so that it can preferentially remove Ge-doped semiconductor layer 210 as opposed to the Ge-doped dielectric material in isolation regions 200.

In referring to FIG. 1 and operation 160 of fabrication method 100, a SiGe stack can be epitaxially grown in each opening 610. In some embodiments, each epitaxially grown SiGe stack features a substantially horizontal top surface and a substantially uniform thickness. In referring to FIG. 7, SiGe stack 700 can have a top surface $700_T$ and a bottom surface $700_B$ that are substantially parallel to "horizontal" plane x-y. In some embodiments, the x-y plane is parallel to a top surface of a substrate, which is not shown in FIG. 7 for simplicity. According to some embodiments, the resulting top surface $700_T$ can be slope-free because the SiGe nanostructure (e.g., in Ge-doped region 300) of each isolation region 200 can act as a "growth surface" with a "reduced" lattice mismatch. In other words, the SiGe and Ge nanostructures in doped region 300 can act as an interface layer (e.g., buffer layer) between the silicon oxide in isolation region 200 and SiGe stack 700. As a result, SiGe and Ge nanostructures in isolation regions 200 can suppress the formation of facets in the SiGe stack 700 that are responsible for the formation of a sloped top surface and thickness non-uniformities in SiGe stack 700.

Figure 7:
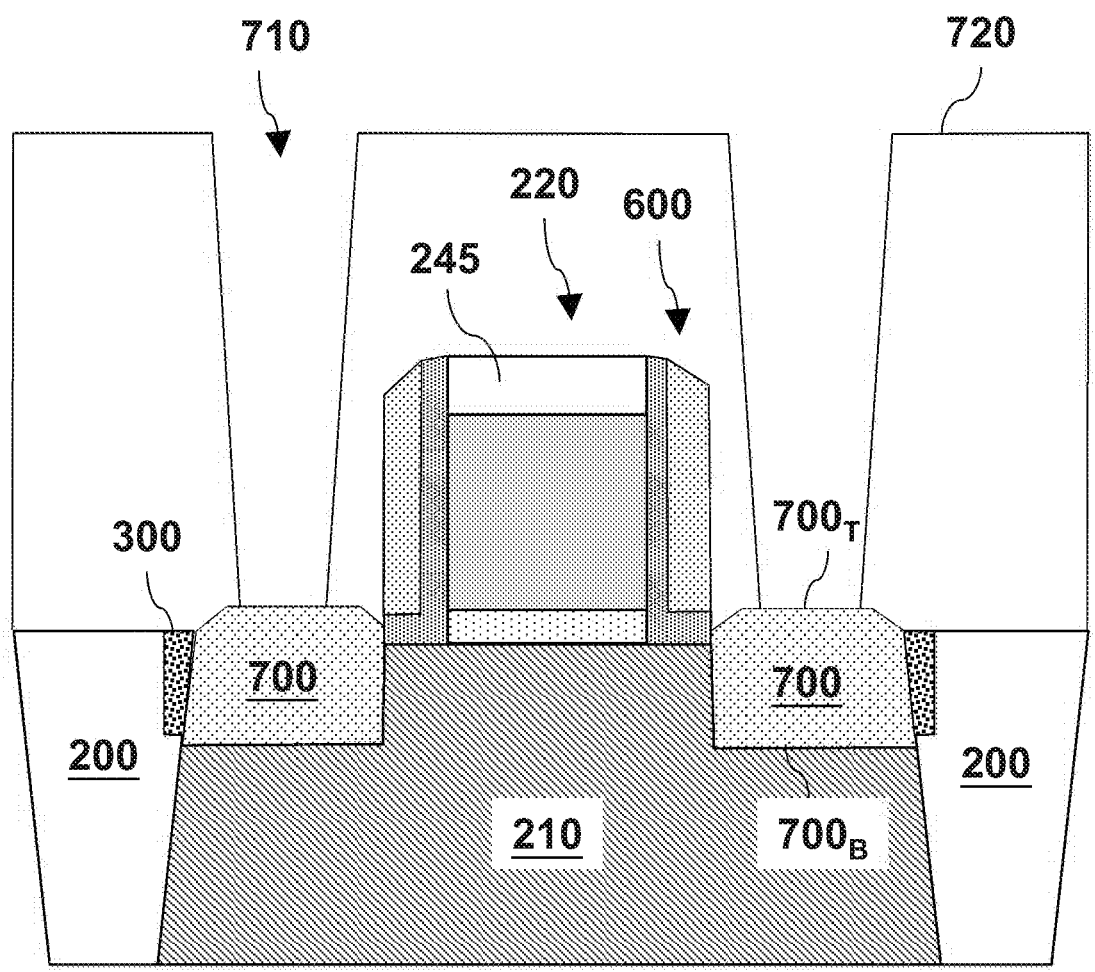
FIG. 7 is a cross-sectional view of a structure with a semiconductor layer surrounded by isolation regions after the formation of a silicon germanium stack with horizontal top surfaces, in accordance with some embodiments.
Figure 7:
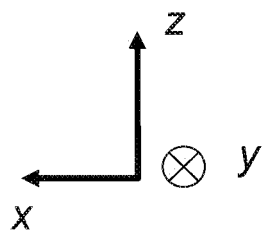

In some embodiments, SiGe stacks 700 can include two or more epitaxial layers, which are not individually shown in FIG. 7 for simplicity. The epitaxial layers can be grown in succession in openings 610 and feature different Ge atomic percentages (atomic %) and B dopant concentrations. By way of example and not limitation, the first layer can have a Ge atomic % that ranges from 0 to about 40%, and a B dopant concentration that ranges from about $5 \times 10^{19}$ atoms/cm$^3$ to about $1 \times 10^{21}$ atoms/cm$^3$. The second epitaxial layer can have a Ge atomic % that ranges from about 20% to about 80%, and a B dopant concentration that ranges from about $3 \times 10^{20}$ atoms/cm$^3$ to about $5 \times 10^{21}$ atoms/cm$^3$. Finally, the third epitaxial layer is a capping layer that can have similar Ge atomic % and B dopant concentrations as the first layer (e.g., 0 to about 40% for Ge, and about $5 \times 10^{19}$ atoms/cm$^3$ to about $1 \times 10^{21}$ atoms/cm$^3$ for B dopant). The thickness of these layers can vary depending on the device performance requirements. For example, the first epitaxial layer can have a thickness range between about 10 nm and about 20 nm, the second epitaxial layer can have a thickness range between about 30 nm to about 60 nm, and the third epitaxial layer (capping layer) can have a thickness range between 0 nm and about 10 nm. The aforementioned concentration and thickness ranges are exemplary and are not intended to be limiting. In some embodiments, the SiGe epitaxial growth process can be performed at high temperatures ranging from about 450° C. to about 740° C. During the epitaxial growth, the process pressure can range between about 1 Torr and about 100 Torr, and the reactant gasses may include silane ($SiH_4$), disilane ($Si_2H_6$), germane ($GeH_4$), diborane ($B_2H_6$), hydrochloric acid (HCl), in which one or more of these reactant gases can be combined with hydrogen ($H_2$), nitrogen ($N_2$), or argon (Ar). The aforementioned ranges and types of gasses are exemplary and are not intended to be limiting.

Figure 8:
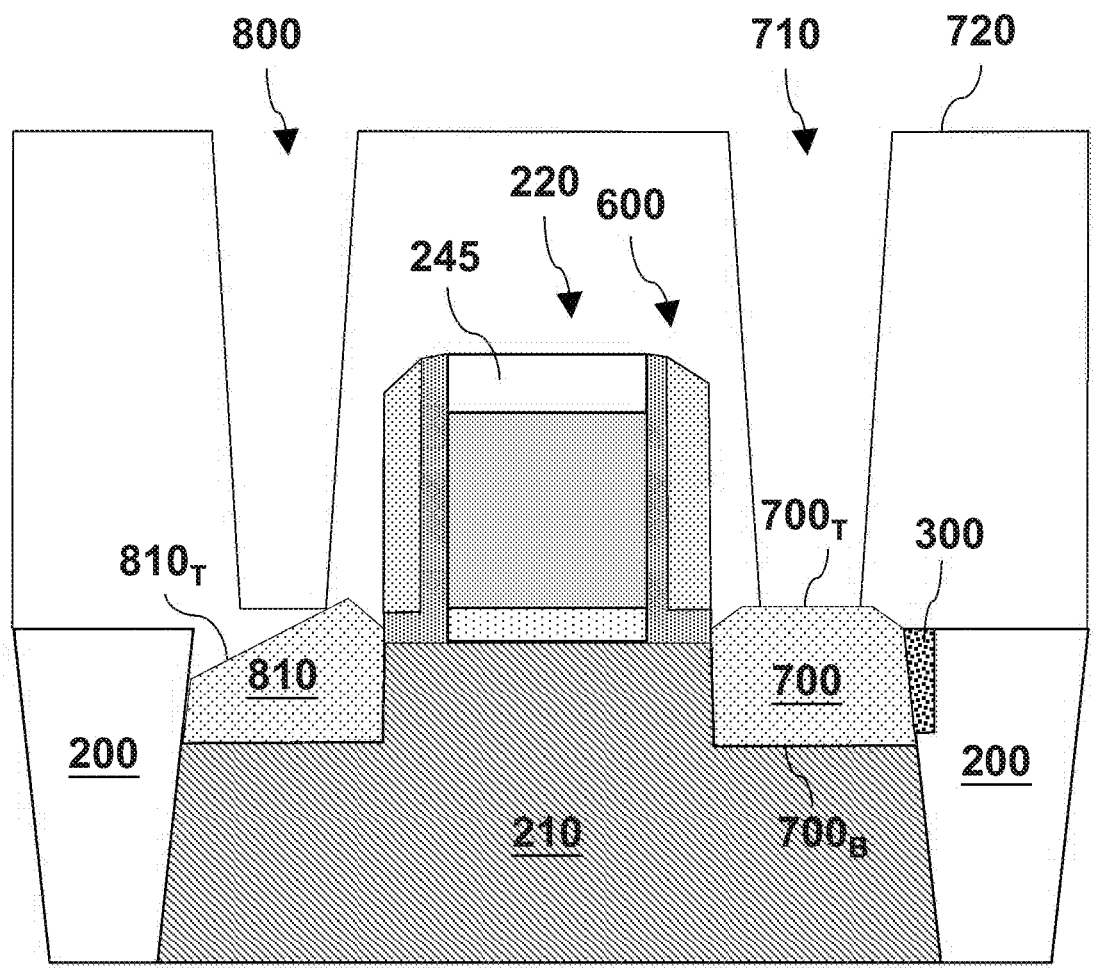
FIG. 8 is a cross-sectional view of a structure with a semiconductor layer surrounded by isolation regions with silicon germanium stacks grown next to isolation regions with and without a silicon germanium nanostructure, in accordance with some embodiments.

In some embodiments and referring to FIG. 7, contact openings 710 can be formed in an interlayer dielectric (ILD) layer 720 over SiGe stacks 700. Contact openings 710 are formed by etching ILD layer 720 (e.g., with a dry etching process) until the top surface of each SiGe stack 700 is exposed as shown in FIG. 8. In some embodiments, contact openings 710 are formed after the replacement of gate structure 220 with a metal gate structure (not shown in FIG. 7). Since top surfaces 700$_T$ of SiGe stacks 700 are grown parallel to the horizontal plane x-y, the etching process window for contact openings 710 can be improved, which is further described with respect to FIG. 8.

In the exemplary structure of FIG. 8, contact opening 710 is formed over "an ideal" SiGe stack 700 that has a top surface 710$_T$ parallel to horizontal plane x-y, and contact opening 800 is formed over a "non-ideal" SiGe stack 810 that has a sloped top surface 810$_T$. According to some embodiments, the sloped top surface 810$_T$ of SiGe stack 810 is attributed to the absence of a SiGe nanostructure in isolation region 200 abutting SiGe stack 810, and the horizontal top surface 700$_T$ of SiGe stack 700 is attributed to the presence of a SiGe nanostructure in Ge-doped region 300 of isolation region 200 abutting SiGe stack 700. In the example of FIG. 8, both contact openings 710 and 800 are formed concurrently during the same etching operation. However, contact opening 800 will have to be formed taller than contact opening 710 due to the sloped geometry of top surface 810$_T$ of SiGe stack 810. Therefore, if the etching process is timed—e.g., based on the time required by the etching process to form contact opening 710 on an ideal SiGe stack 700—contact opening 800 may not be completely formed on a less ideal SiGe stack 810, as shown in FIG. 8.

Further, if the etching process is designed to end-point when, for example, SiGe is exposed, contact opening 800 may not be formed because contact opening 710 will first expose SiGe stack 700 and signal the end of the etching process. Therefore, an "over-etch" process will be required so that both contact openings 800 and 710 are formed. However, if an over-etch process is used, SiGe stack 700 will be subjected to additional etching for the duration of the over-etch process—e.g., while contact opening 800 is being formed. The over-etch process can damage the epitaxial layers of SiGe stack 700. Further, the slope of top surface 810$_T$ may vary from SiGe stack to SiGe stack. For example, non-ideal SiGe stacks (e.g., like stack 810) can have top surfaces that form a different slope angle with the horizontal x-y plane. Consequently, determining an over-etch process window for the formation of contact openings on non-ideal SiGe stacks with varying degrees of sloped top surfaces can be challenging. This in turn can cause ambiguity in the contact etching process and can lead to un-etched contact openings across the substrate. In contrast, the formation of SiGe nanostructures in Ge-doped regions 300 of isolation regions 200, according to fabrication method 100, can reduce the appearance of facets and the growth of less ideal SiGe stacks like SiGe stack 810.

Figure 9:
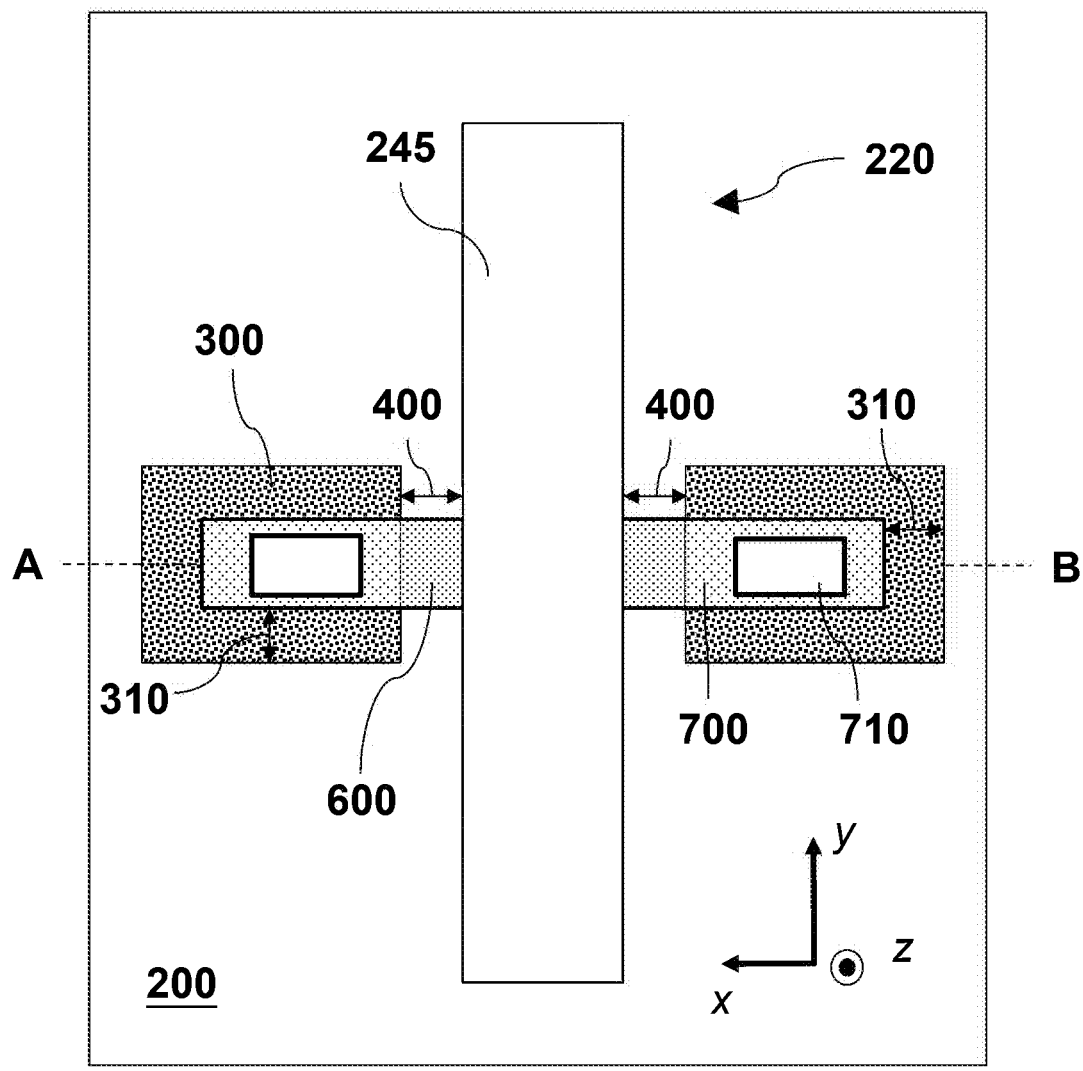
FIGS. 9-11 are exemplary layouts of semiconductor layers surrounded by isolation structures with germanium doped regions, in accordance with some embodiments.
Figure 10:
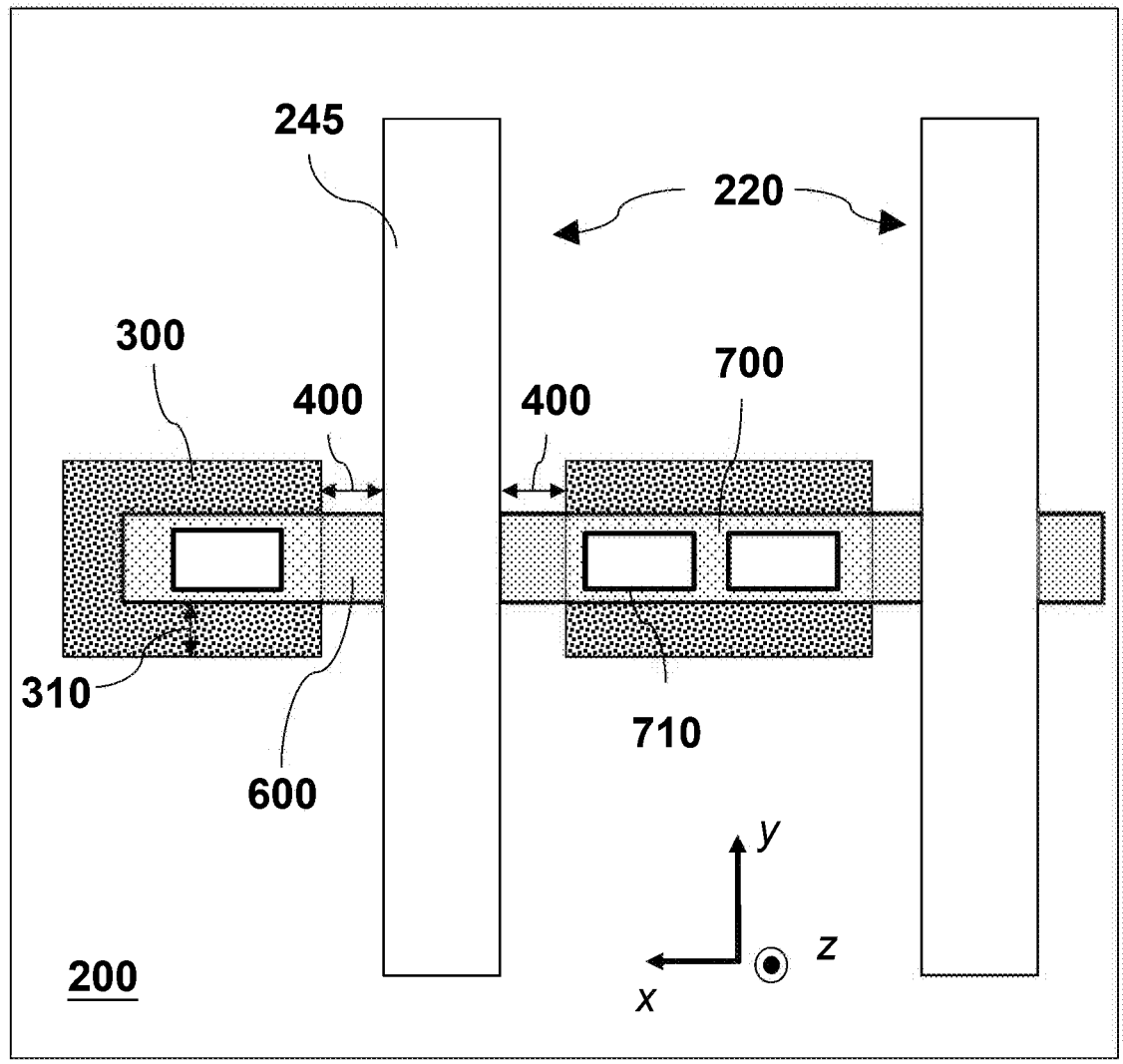
Figure 11:
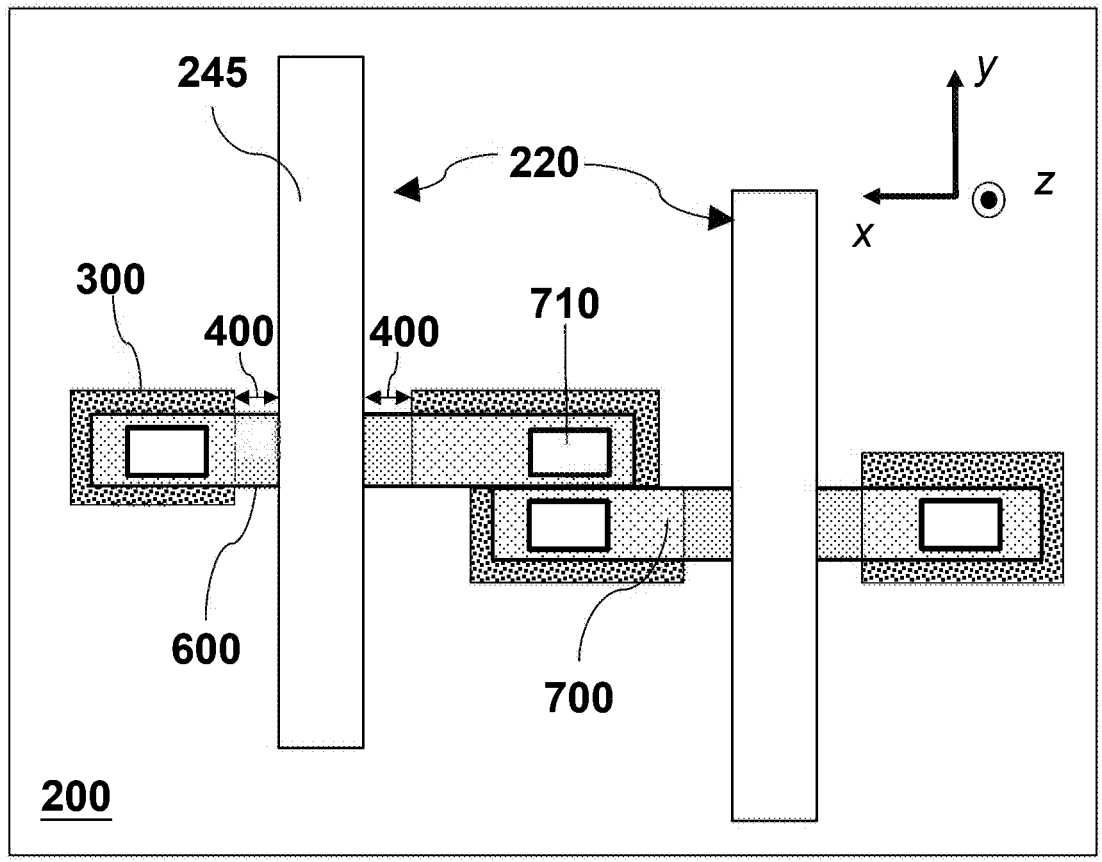

In some embodiments, FIG. 9 is a top view of FIG. 8. The embodiments described herein are not limited to the exemplary layout of FIG. 9 and additional layouts with different gate structure and semiconductor layer arrangements are within the spirit and scope of this disclosure. For example, FIGS. 10 and 11 provide additional layouts where additional gate structures and semiconductor layers are provided in different arrangements, according to some embodiments. In each of these arrangements shown in FIGS. 10 and 11, Ge-doped regions 300 are surrounding respective SiGe stacks 700.

Figure 12:
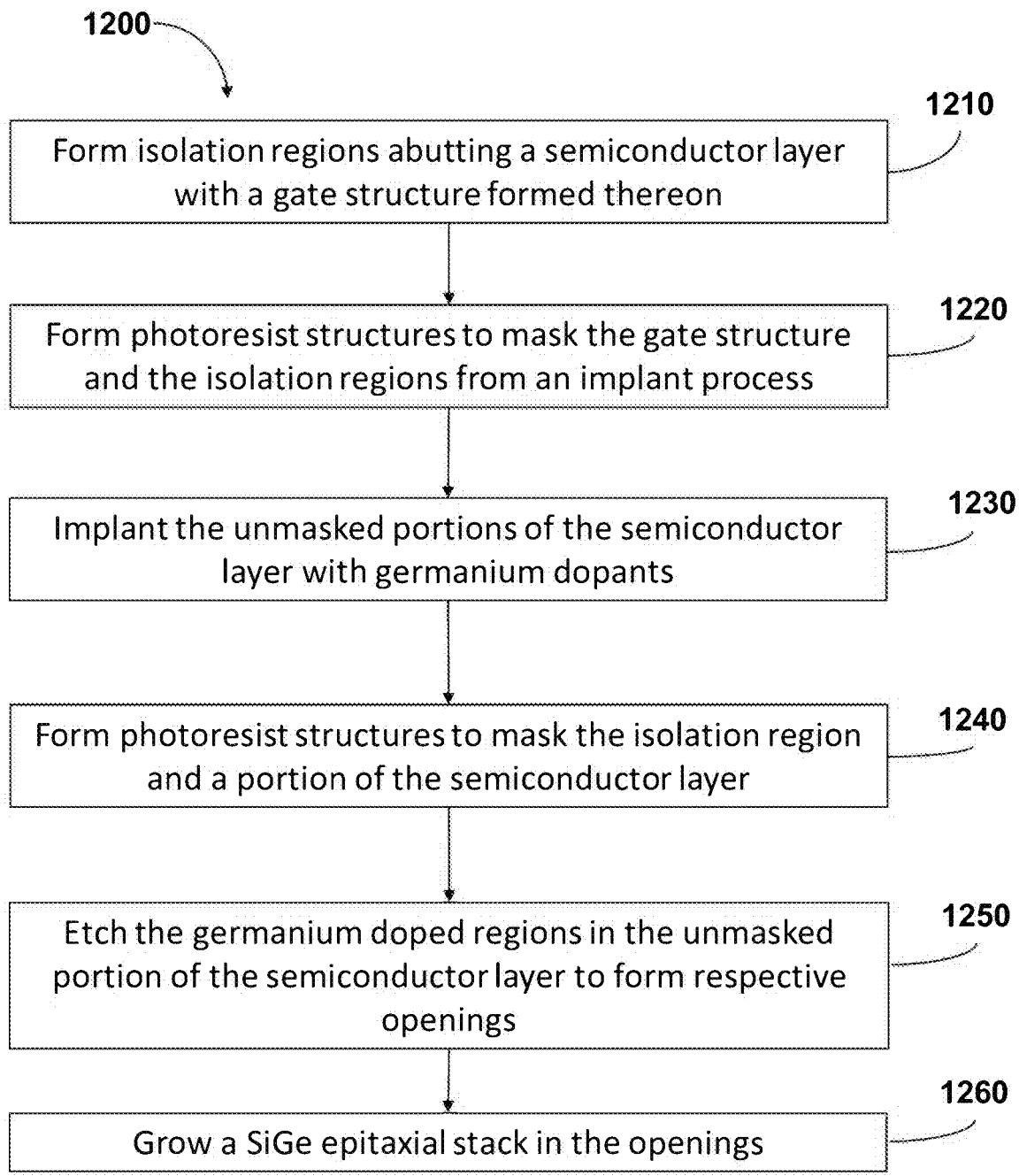
FIG. 12 is a flow diagram of an exemplary fabrication method for the formation of a silicon germanium nanostructure in a semiconductor layer and adjacent to an isolation structure, in accordance with some embodiments.

FIG. 12 is a flow chart of an exemplary fabrication method 1200 according to some embodiments of the present disclosure. Fabrication method 1200 describes the formation of a SiGe nanostructure adjacent to the isolation region and within the semiconductor layer. In some embodiments, the SiGe nanostructure is formed by doping a selected area of the semiconductor layer adjacent to the isolation region with Ge dopants. The SiGe nanostructure disposed in the semiconductor layer between the isolation region and the SiGe epitaxial layer promotes the formation of SiGe epitaxial layers with a substantial horizontal top surface and uniform thickness. This disclosure is not limited to this operational description. Rather, other operations are within the spirit and scope of the present disclosure. It is to be appreciated that additional operations may be performed. Moreover, not all operations may be needed to perform the disclosure provided herein. Additionally, some of the operations may be performed simultaneously, or in a different order than shown in FIG. 12. In some implementations, one or more other operations may be performed in addition to or in place of the presently described operations. For illustrative purposes, fabrication method 1200 is described with reference to the embodiments shown in FIGS. 13 through 21.

Figure 13:
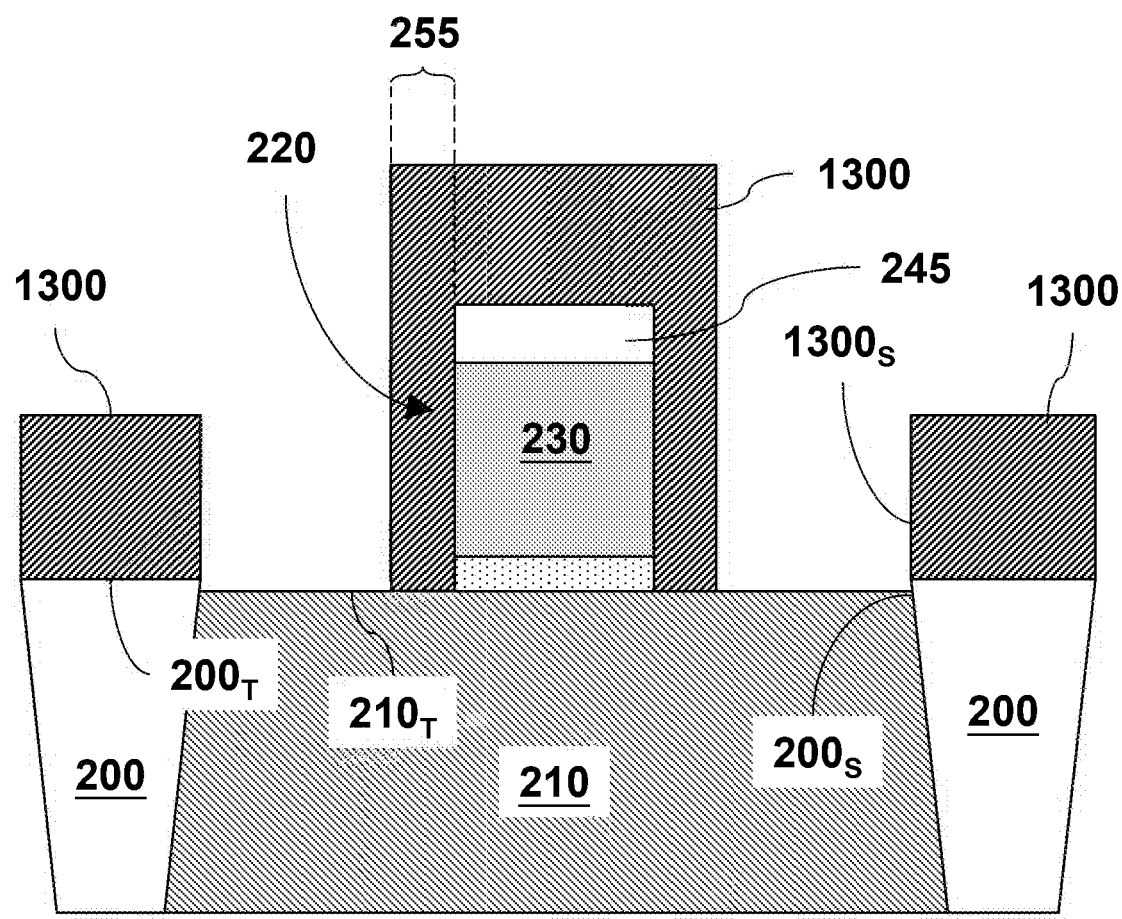
FIG. 13 is a cross-sectional view of a structure with a semiconductor layer surrounded by isolation regions after the formation of photoresist structures, in accordance with some embodiments.

Fabrication method 1200 begins with operation 1210, where isolation regions can be formed abutting a semiconductor layer with a gate structure formed on the semiconductor layer. By way of example and not limitation, FIG. 13, similarly to FIG. 2, is a cross sectional view of isolation regions 200 abutting a semiconductor layer 210 with a gate structure 220 formed thereon. In some embodiments, isolation regions 200 can be STI regions filled with an amorphous dielectric material, such as silicon oxide. Semiconductor layer 210 can be an OD region. In some embodiments, top surfaces 200$_T$ of isolation regions 200 are not coplanar with top surface 210$_T$ of semiconductor layer 210. For example, top surface 210$_T$ can be below the level of top surface 200$_T$, as shown in FIG. 13. However, this is not limiting, and top surfaces 200$_T$ and 210$_T$ can be coplanar. Further 200$_T$ and 210$_T$ are horizontal surfaces, e.g., nominally parallel to the x-y plane and nominally parallel to a top surface of a substrate (not shown in FIG. 13).

For example purposes, semiconductor layer 210 and isolation regions 200 in fabrication method 100 will be described in the context of a crystalline silicon layer and amorphous silicon oxide, respectively. Based on the disclosure herein, other materials, as discussed above, can be used. These materials are within the spirit and scope of this disclosure.

As discussed above, gate structure 220 is a sacrificial gate structure that can be replaced with a metal gate structure in a later operation. Gate structure 220 can further include a gate electrode 230 and gate dielectric 240. In some embodiments, gate electrode 230 includes polycrystalline silicon ("poly"), and gate dielectric 240 includes a dielectric, such as silicon oxide grown over semiconductor layer 210. Further, gate electrode 230 of gate structure 220 can be capped with a hard mask layer 245, as shown in FIG. 13. In some embodiments, hard mask layer 245 is an oxide (e.g., silicon oxide), a nitride (e.g., silicon nitride), or a stack that includes an oxide and a nitride. In some embodiments, hard mask layer 245 protects gate structure 220 from a subsequent etching process.

In operation 1220 of fabrication method 1200, photoresist structures can be formed to mask the gate structure and the isolation regions from a subsequent implant operation. By way of example and not limitation, the photoresist structures can be formed by patterning a photoresist layer. As shown in FIG. 13, photoresist structures 1300 mask gate structure 220 and isolation regions 200. In other words, photoresist structures 250 overlap with top surface 200$_T$ of isolation region 200 so that the inner sidewall surfaces 1300$_S$ of photoresist structures 1300 are aligned to the upper sidewall surfaces 200$_S$ of the underlying isolation regions 200. In some embodiments, the width of photoresist structure 1300 over gate structure 220 is larger than the width of gate structure 220, as shown in FIG. 13. For example, on each side of the photoresist structure 250 extends beyond the edges of gate structure 220 by an overlay width 255. Since each photoresist structure 1300 is an implant mask, openings between the photoresist structures define the areas that can be implanted with Ge dopants.

Figure 14:
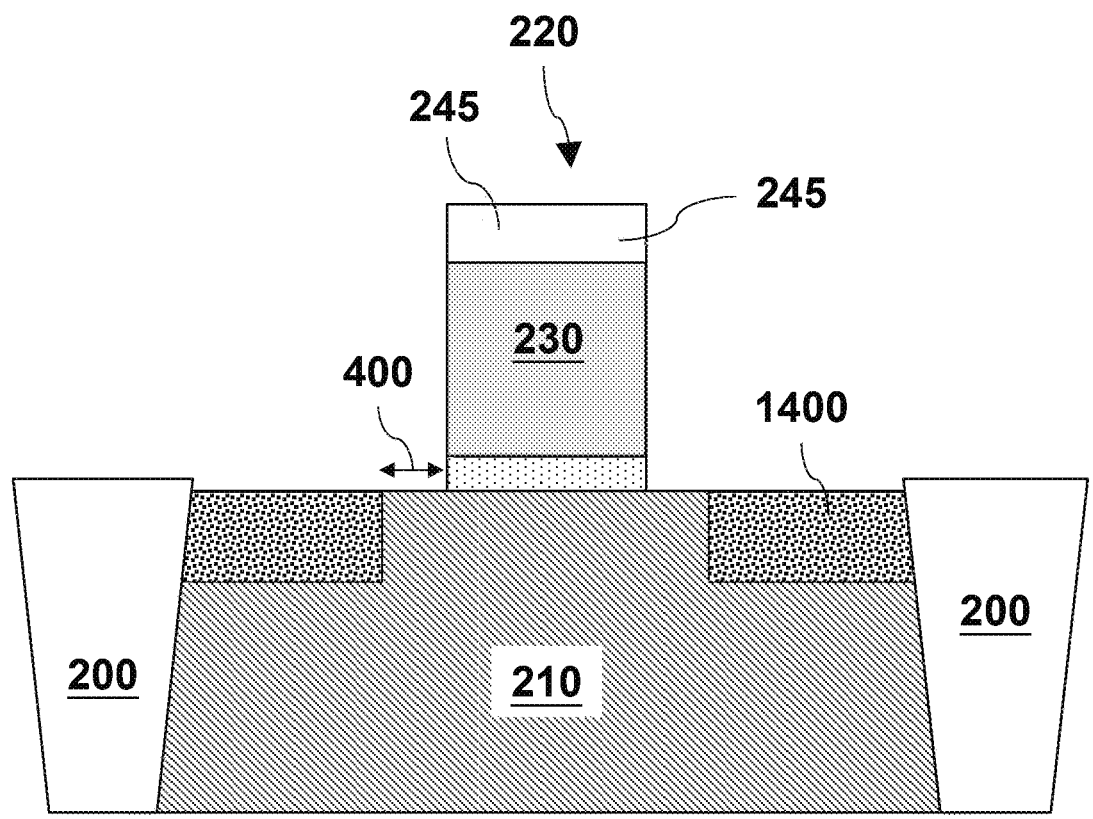
FIG. 14 is a cross-sectional view of a structure with a semiconductor layer surrounded by isolation regions after the formation of a germanium doped region in the semiconductor layer, in accordance with some embodiments.
Figure 15:
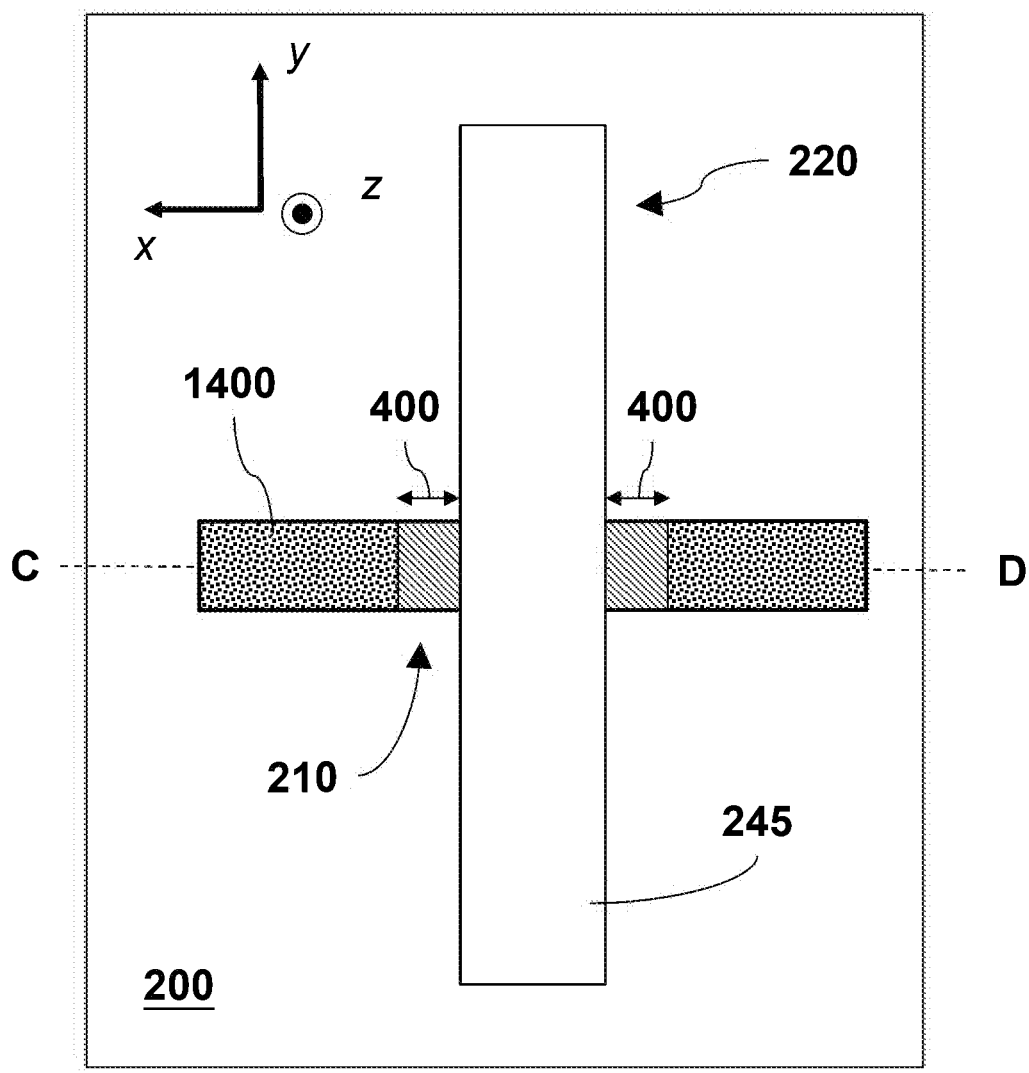
FIG. 15 is a top-view of a structure with a semiconductor layer having a germanium doped region therein and surrounded by an isolation region, in accordance with some embodiments.

Referring to FIG. 12, fabrication method 1200 continues with operation 1230, where the unmasked, or exposed, portions of semiconductor layer 210 are implanted with Ge dopants. A purpose of operation 1230 is to form Ge-doped regions in the semiconductor layer. For example, FIG. 14 shows Ge-doped regions 1400 formed in semiconductor layer 210 after the implant process of operation 1230. In the example of FIG. 14, photoresist structures 1300 have been removed with an etching process (e.g., wet etching process). FIG. 15 is a top view of the structure depicted in FIG. 14. In some embodiments, FIG. 14 is a cross-sectional view of FIG. 15 along dotted line CD. As mentioned above, the dimensions and relative position of gate structure 220 and semiconductor layer 210 are not limited to the example of FIG. 15. Therefore, alternative dimensions and placement of gate structure 220 and semiconductor layer 210 are possible. Further, multiple gate structures and semiconductor layers are possible.

In some embodiments, the implant dose during the implant process of operation 1230 can range from about $1\times10^{16}$ to about $1\times10^{18}$ ions per $cm^2$. An optional rapid thermal annealing process or another thermal treatment can activate the Ge dopants (e.g., allow the Ge dopants to diffuse and chemically bond with the silicon atoms). Referring to FIGS. 14 and 15, doped region 1400 in semiconductor layer 210 can extend to the interface with isolation region 200. In some embodiments, thermal activation of the Ge dopants at temperatures between about 600° C. and 1100° C. results in the formation of SiGe nanostructures in semiconductor layer 210. For example, a SiGe crystalline nanostructure can be formed when Ge dopants diffuse and bond with the silicon atoms in semiconductor layer 210. The formed SiGe nanostructures may have a lattice constant that is closer matched to the lattice constant of the epitaxially grown SiGe layers (e.g., between about 5.5 Å and about 5.6 Å)

In some embodiments and referring to FIG. 15, the placement of Ge-doped region 1400 is such that a distance 400 between gate structure 220 and Ge-doped region 1400 is maintained at about 40 nm or greater (e.g., ≥40 nm) to prevent leakage current between a channel region (not shown in FIG. 15) formed in semiconductor layer 210 (e.g., below gate structure 220) and the Ge-doped region 1400. In some embodiments, distance 400 is controlled through overlay width 255 between photoresist structure 1300 and gate structure 220, as shown in FIG. 13. In some embodiments, distance 400 is equal to the total thickness of spacers 600 on the sidewalls of gate structure 220.

Figure 16:
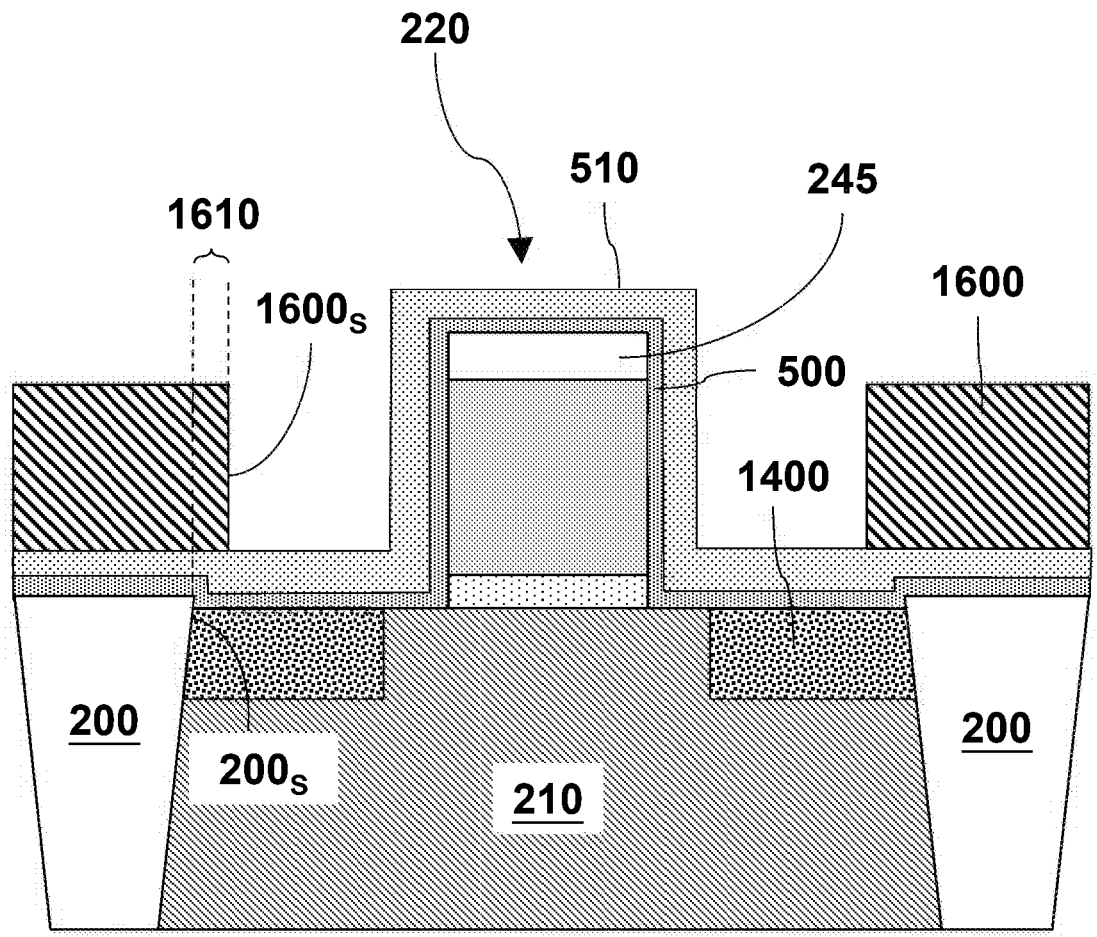
FIG. 16 is a cross-sectional view of a structure with a semiconductor layer surrounded by isolation regions after a conformal deposition of an oxide and a nitride layer, in accordance with some embodiments.

In referring to FIG. 16, an oxide layer 500 and a nitride layer 510 can be conformally deposited over gate structure 220, semiconductor layer 210, and isolation regions 200. By way of example and not limitation, oxide layer 500 can include silicon oxide ($SiO_x$) deposited from TEOS, and nitride layer 510 can include silicon nitride ($SiN_x$).

In referring to FIG. 12 and operation 1240, photoresist structures can be formed to mask isolation regions 200 and a portion of semiconductor layer 210 in preparation for a subsequent etching operation. In some embodiments, the photoresist structures are etch mask structures that protect the underlying portions of isolation regions 200 and semiconductor layer 210 from being etched during an etching process (e.g., dry etching process). Referring to FIG. 16, photoresist structures 1600 are formed over isolation regions 200 and a portion of semiconductor layer 210, so that the inner sidewall surfaces 1600$_S$ of photoresist structures 1600 are extending over semiconductor layer 210 by a width 1610. In other words the distance between the upper sidewall surface 200$_S$ of isolation region 200 and the sidewall surface 1600$_S$ of photoresist structure 1600 is equal to width 1610. Therefore, the portion of Ge-doped region 1400 that is masked by photoresist structure 1600 has width 1610, as shown in FIG. 16. The portions of Ge-doped region 1400 within semiconductor layer 210 not masked by photoresist structures 1600 are exposed to the etching chemistry of the subsequent etching operation. In some embodiments, photoresist structures 1600 are formed by exposing and developing (e.g., patterning) a photoresist layer that is disposed over gate structure 220, isolation regions 200, and semiconductor layer 210.

Figure 17:
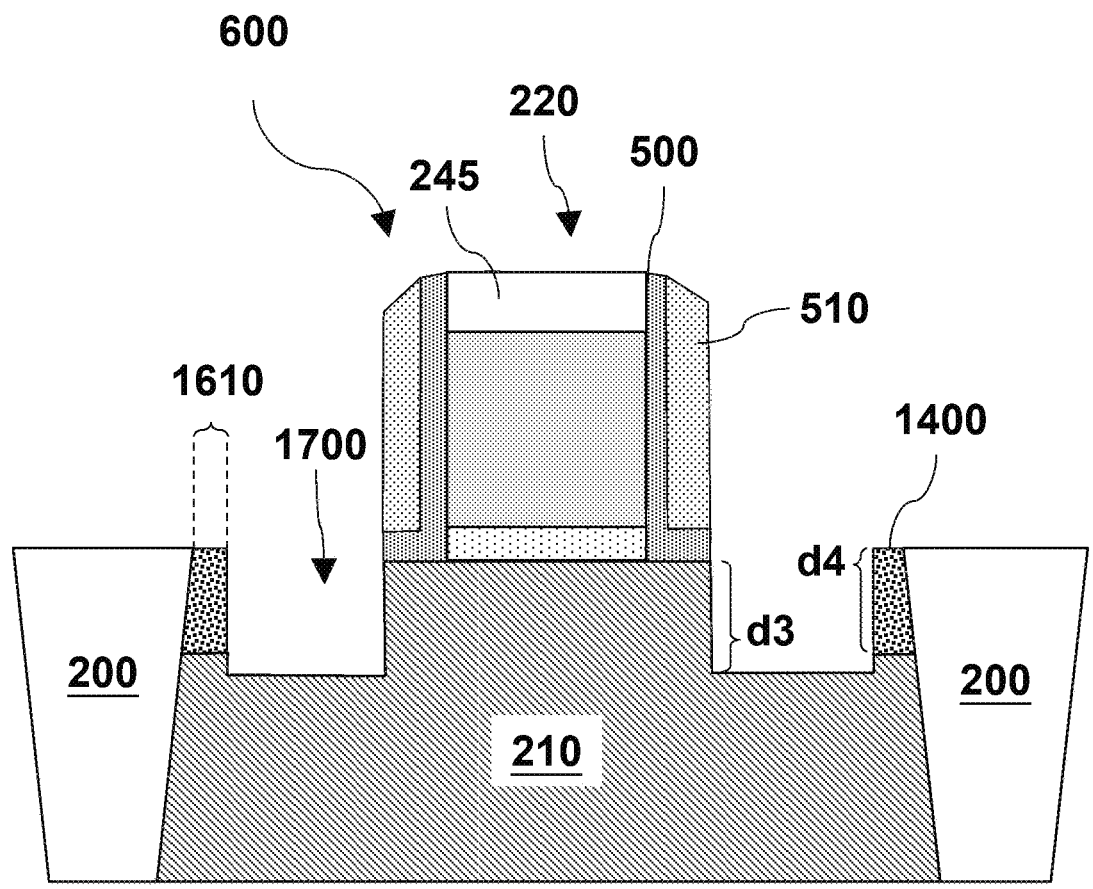
FIG. 17 is a cross-sectional view of a structure with a semiconductor layer surrounded by isolation regions after partially etching a germanium doped region from the semiconductor region, in accordance with some embodiments.

In referring to FIG. 12 and operation 1250 of fabrication method 1200, unmasked portions of Ge-doped regions 1400 in semiconductor layer 210 are etched to form respective openings. According to some embodiments, FIG. 17 shows the structure of FIG. 16 after the etching process of operation 1250. In some embodiments, the etching process can include multiple etching steps. Further, these etching steps may not be limited to the same etching chemistry because they are designed to remove different types of materials (e.g., oxides, nitrides, silicon, etc.). By way of example and not limitation, a first etching step can be configured to preferentially remove nitride layer 510 and oxide layer 500 from the horizontal surfaces of the structure shown in FIG. 16 (e.g., the top surfaces of gate structure 220, semiconductor layer 200 and isolation regions 200). At the same time, the first etching step can partially etch nitride layer 510 and oxide layer 500 from vertical surfaces, such as the sidewalls of gate structure 220. Consequently, spacers 600 are formed on the sidewalls of gate structure 220, as shown in FIG. 17. By way of example and not limitation the first etching step can be an anisotropic dry etching process configured to exhibit a directional etching along the z-direction (e.g., perpendicular to the top surface of gate structure 220 and semiconductor layer 210).

Once the top surface of semiconductor layer 210 is exposed, a second etching step can etch away the unmasked portions of Ge-doped regions 1400 in semiconductor layer 210 to form respective openings 1700. In some embodiments, the second etching step is an anisotropic dry etching process configured to preferentially etch Ge-doped regions 1400 in semiconductor layer 210. In some embodiments, the dry etching process can be end-pointed when, for example, Ge-doped regions 1400 in semiconductor layer 210 are removed and the underlying substantially Ge-free semiconductor layer 210 is exposed. As discussed above, the term "Ge-free", as used herein, refers to semiconductor layer 210 that is substantially free from Ge-dopants but can be doped with other types of dopants (e.g., boron, phosphorous, arsenic, etc.) or can be un-doped. In some embodiments, the drying etching process is a timed process or a combination of timed and end-pointed processes. By way of example and not limitation, the etching chemistry of the etching process can etch Ge-doped semiconductor layer 210 faster than Ge-free semiconductor layer 210. Hence, a slow etching rate in the etching process can signal the end of the etching process and the removal of Ge-doped regions 1400. In some embodiments the etching process is configured so that depth d3 of opening 610 is equal or greater than depth d4 of SiGe nanostructure (e.g., Ge-doped region 1400) in isolation region 200 (e.g., d3≥d4).

In some embodiments, the masked portion of Ge-doped regions 1400 in semiconductor layer 210 are not etched (e.g., removed) during operation 1250, as shown in FIG. 17. As discussed above, this is because photoresist structures 1600 (e.g., shown in FIG. 16) partially mask, by width 1610, the Ge-doped regions in semiconductor layer 210 during the etching process of operation 1250. Consequently, the width of the un-etched portions of Ge-doped regions 1400 can be substantially equal to width 1610. In some embodiments, due to the implant process variation and subsequent annealing process, Ge implants may diffuse beyond the semiconductor layer/isolation region interface into isolation region 200. However, the diffusion length can be limited by the annealing temperature of the annealing process. Therefore, in some embodiments, the width of the un-etched Ge-doped regions 1400 can be larger than width 1610 (e.g., within about 1 nm or less). Regardless, the extension of Ge-doped regions 1400 into isolation regions 200 is not a limitation for fabrication method 1200.

In referring to FIG. 12 and operation 1260 of fabrication method 1200, a SiGe stack can be epitaxially grown in each opening 1700. In some embodiments, each epitaxially grown SiGe stack features a substantially horizontal top surface (e.g., slope-free) and uniform thickness. In referring to FIG. 18, SiGe stack 1800 can have a top surface 1800$_T$ and a bottom surface 1800$_B$ that are substantially parallel to horizontal plane x-y. In some embodiments, the x-y plane is parallel to a top surface of a substrate, which is not shown in FIG. 18 for simplicity. According to some embodiments, the resulting top surface 1800$_T$ can be slope-free because the SiGe nanostructure in semiconductor layer 210 can act as a "reduced" lattice mismatch "growth surface" for SiGe stack 1800. As a result, SiGe nanostructures in semiconductor layer 210 can suppress the formation of facets in SiGe stack 1800 that are responsible for the formation of a sloped top surface in SiGe stack 1800.

Figure 18:
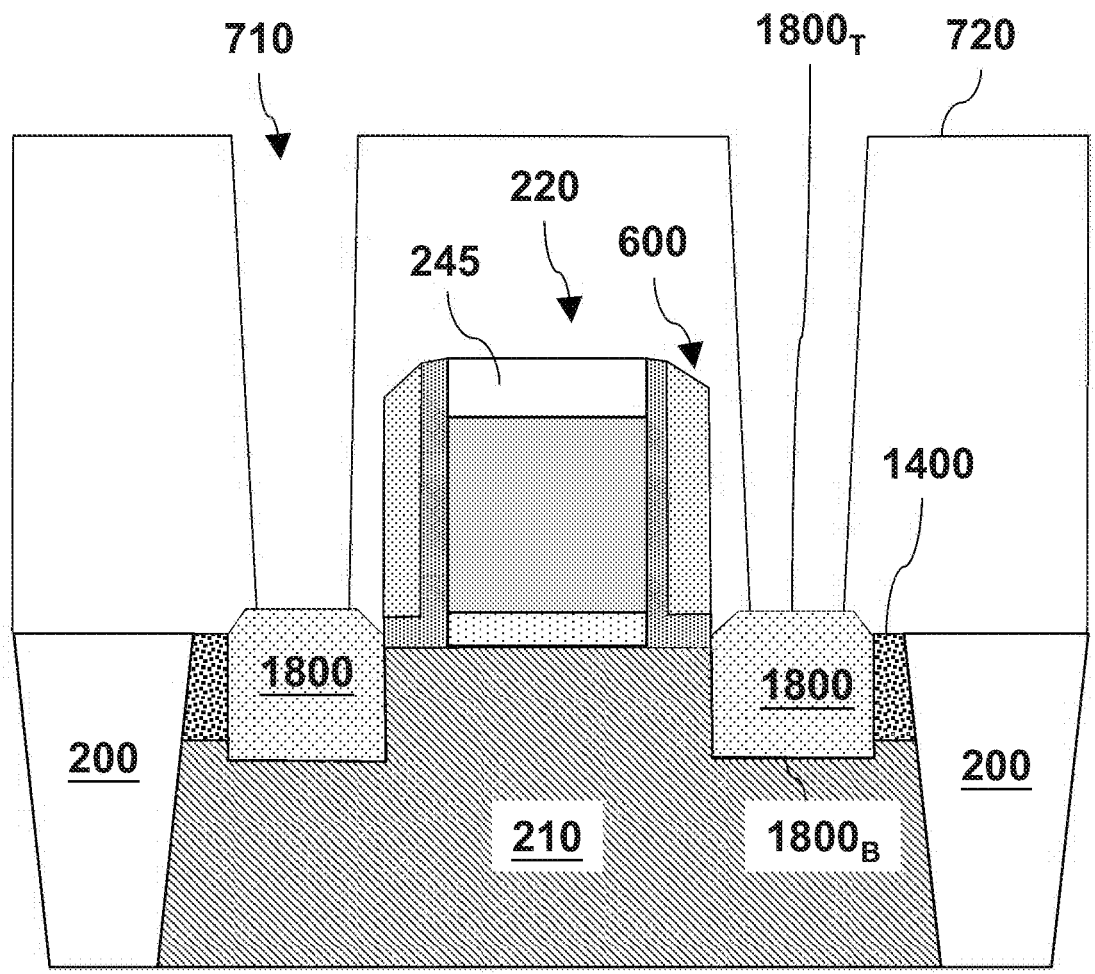
FIG. 18 is a cross-sectional view of a structure with a semiconductor layer surrounded by isolation regions after the formation of silicon germanium stack with horizontal top surfaces, in accordance with some embodiments.

In some embodiments, contact openings 710 can be formed in an interlayer dielectric (ILD) layer 720 over SiGe stacks 700, as shown in FIG. 18. In some embodiments, contact openings 710 are formed after the replacement of gate structure 220 with a metal gate structure (not shown in FIG. 18). Contact openings 710 are formed by etching ILD layer 720 (e.g., with a dry etching process) until the top surface of each SiGe stack 1800 is exposed as shown in FIG. 18. Since top surfaces 1800$_T$ of SiGe stacks 1800 are grown parallel to the horizontal plane x-y, the etching process window for contact openings 710 can improve as discussed above.

Figure 19:
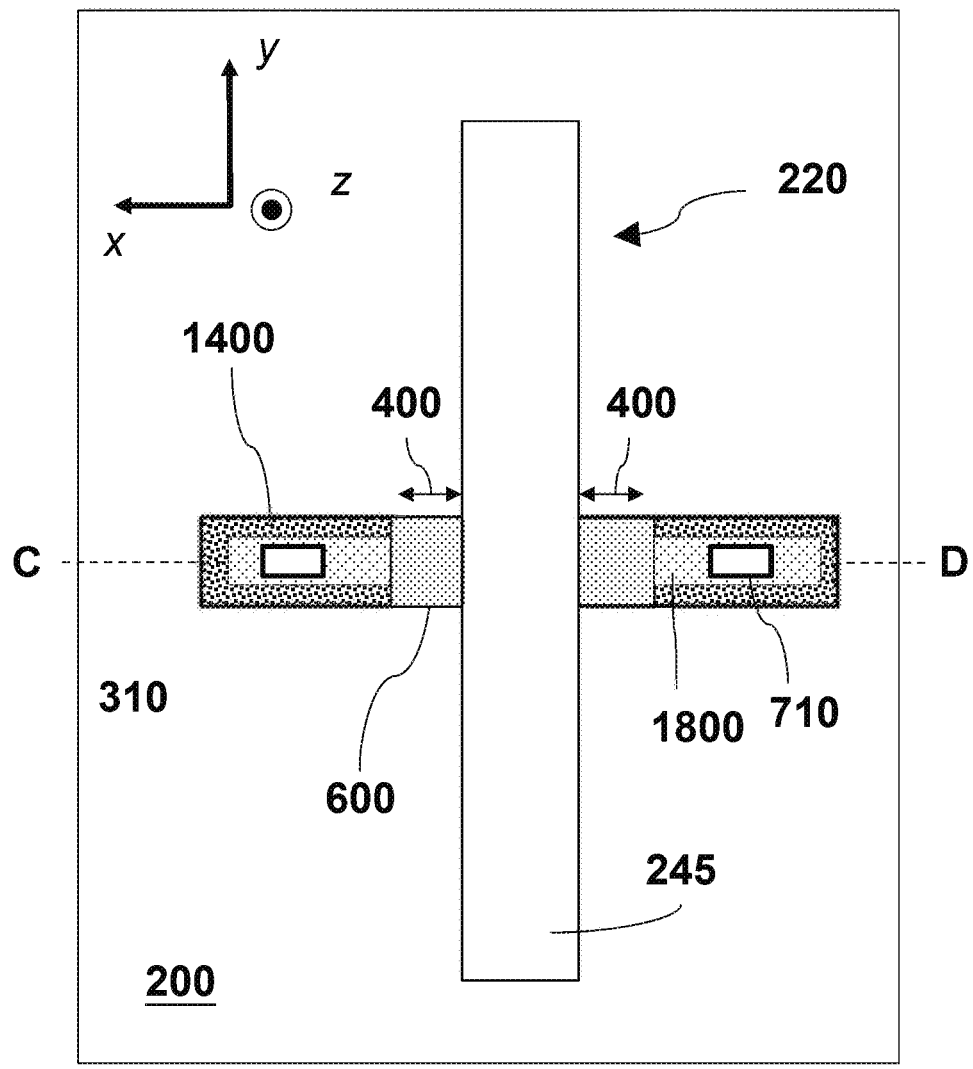
FIGS. 19-21 are exemplary layouts of semiconductor layers with germanium doped regions surrounded by isolation structures, in accordance with some embodiments.
Figure 20:
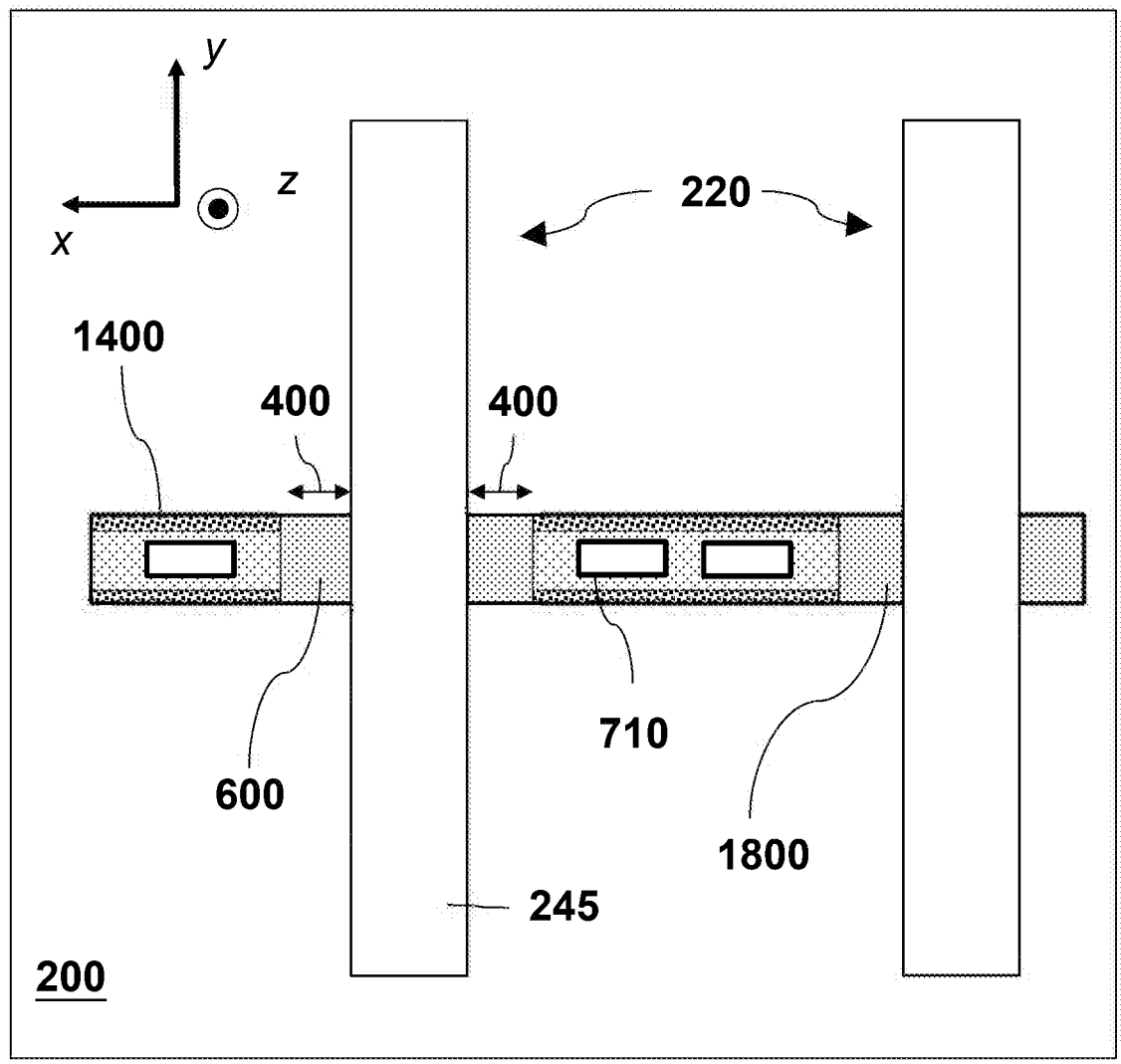
Figure 21:
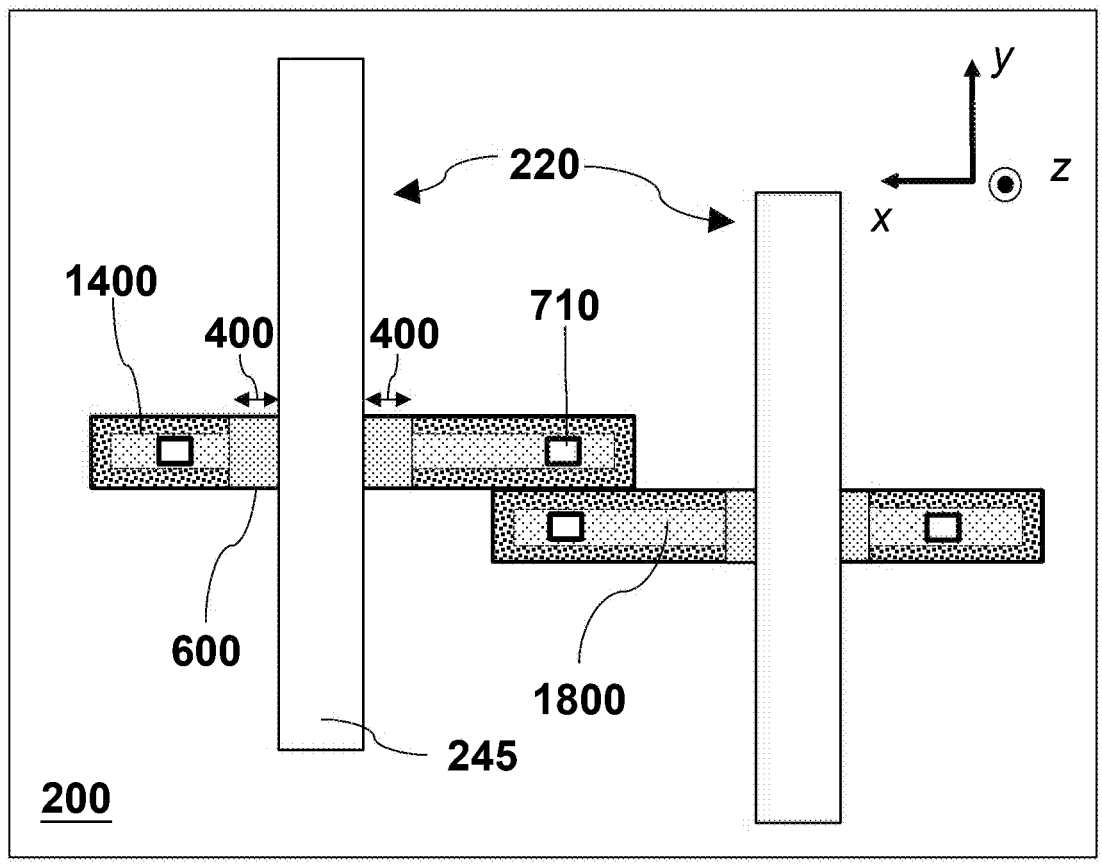

In some embodiments, FIG. 19 is a top view of FIG. 18. The embodiments described herein are not limited to the exemplary layout of FIG. 19 and additional layouts with different gate structure and semiconductor layer arrangements are within the spirit and scope of this disclosure. For example, FIGS. 20 and 21 provide additional layouts, where additional gate structures and semiconductor layers are provided in different arrangements, according to some embodiments. In each of these arrangements shown in FIGS. 20 and 21, Ge-doped regions 1400 are interposed between respective SiGe stacks 1800 and isolation region 200.

The present disclosure is directed to a method that mitigates, or eliminates, the formation of facets in source/drain SiGe epitaxial layers. As a result, the SiGe epitaxial layers can be grown with a horizontal top surface across the source/drain region to improve the etching process window during the contact opening formation. In some embodiments, this can be accomplished by forming a SiGe nanostructure at the interface of the semiconductor/isolation region. For example, the SiGe nanostructure can be either formed in the semiconductor layer or in the isolation region. In some embodiments, the SiGe nanostructure can be used as a growth surface with reduced lattice mismatch for the SiGe epitaxial layers in the source/drain region. In some embodiments, the Ge implant dose can range from about $10^{15}$ atoms/cm$^2$ to about $10^{16}$ atoms/cm$^2$ and the resulting Ge implanted area can have a width between about 5 nm and about 25 nm. Further, the distance between a gate structure and the SiGe nanostructures can be equal to or greater than about 40 nm.

In some embodiments, a semiconductor structure includes a semiconductor layer over a substrate; an isolation region abutting the semiconductor layer, wherein the isolation region comprises a silicon germanium (SiGe) structure; and an epitaxial stack, in the semiconductor layer, comprising at least one common sidewall with the SiGe structure.

In some embodiments, a semiconductor structure includes a semiconductor layer over a substrate, wherein the semiconductor layer comprises a silicon germanium (SiGe) structure; an epitaxial stack partially disposed in the semiconductor layer and in contact with the SiGe structure; and an isolation region surrounding the semiconductor layer, wherein the SiGe structure is interposed between the isolation region and the epitaxial stack.

In some embodiments, a method includes forming an isolation region around a semiconductor layer; forming a gate structure partially over the semiconductor layer and the isolation region; disposing first photoresist structures over the gate structure, a portion of the isolation region, and a portion of the semiconductor layer; doping, with Ge, exposed portions of the semiconductor layer and exposed portions of the isolation region to form Ge-doped regions that extend from the semiconductor layer to the isolation region. The method further includes disposing second photoresist structures over the isolation region; etching exposed Ge-doped regions in the semiconductor layer to form openings, where the openings includes at least one common sidewall with the Ge-doped regions in the isolation region; and growing a silicon germanium (SiGe) epitaxial stack in the openings.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming an isolation region adjacent to a semiconductor layer;
   doping, with germanium (Ge), a portion of the semiconductor layer and a portion of the isolation region to form a Ge-doped region that extends from the semiconductor layer to the isolation region;
   etching the Ge-doped region in the semiconductor layer to form openings, wherein the openings comprise at least one common sidewall with the Ge-doped region in the isolation region; and
   forming a silicon germanium (SiGe) epitaxial stack in the openings.

2. The method of claim 1, further comprising, prior to etching the Ge-doped region in the semiconductor layer, performing an anneal process to convert the Ge-doped region in the isolation region to a SiGe structure.

3. The method of claim 2, wherein forming the SiGe epitaxial stack comprises growing the SiGe epitaxial stack on a sidewall of the SiGe structure in the isolation region.

4. The method of claim 1, wherein doping with the Ge comprises implanting a Ge dopant dose between about $1\times10^{16}$ ions/cm$^2$ and about $1\times10^{18}$ ions/cm$^2$.

5. The method of claim 1, wherein etching the Ge-doped region in the semiconductor layer to form the openings comprises forming the openings with a bottom surface lower than a bottom surface of the Ge-doped region in the isolation region.

6. The method of claim 1, wherein forming the SiGe epitaxial stack comprises forming the SiGe epitaxial stack with a depth equal to or greater than a depth of the Ge-doped region in the isolation region.

7. The method of claim 1, further comprising, prior to etching the Ge-doped region in the semiconductor layer, masking an entire top surface of the isolation region.

8. The method of claim 1, wherein etching the Ge-doped region in the semiconductor layer comprises removing the Ge-doped region from the semiconductor layer.

9. A method, comprising:
   forming an isolation region on side surfaces of a fin structure;
   forming a gate structure on a first portion of the fin structure;
   forming a first masking structure to cover the gate structure and a second portion of the fin structure, wherein the second portion is wider than the first portion;
   forming a germanium-doped (Ge-doped) region in a third portion of the fin structure, wherein the third portion of the fin structure extends between the first masking structure and the isolation region;
   forming a second masking structure to cover the isolation region and an area of the Ge-doped region in the third portion of the fin structure adjacent to the isolation region;
   removing the Ge-doped region in the third portion of the fin structure between the gate structure and the second masking structure to form an opening in the fin structure; and
   growing an epitaxial stack in the opening, wherein the epitaxial stack is in contact with the area of the Ge-doped region in the third portion of the fin structure.

10. The method of claim 9, wherein removing the Ge-doped region to form the opening comprises forming the opening narrower than the third portion of the fin structure.

11. The method of claim 9, wherein growing the epitaxial stack comprises growing a silicon-germanium (SiGe) stack in contact with un-etched portions of the Ge-doped region in the third portion of the fin structure.

12. The method of claim 9, wherein forming the Ge-doped region in the third portion of the fin structure comprises forming the Ge-doped region abutting side surfaces of the isolation region.

13. The method of claim 9, further comprising, prior to forming the second masking structure:
    removing the first masking structure; and
    forming gate spacers on sidewall surfaces of the gate structure, wherein the gate spacers extend between the sidewall surfaces of the gate structure and the third portion of the fin structure.

14. The method of claim 9, wherein growing the epitaxial stack comprises forming the epitaxial stack in contact with a depth equal to or greater than a depth of the Ge-doped region in the third portion of the fin structure.

15. The method of claim 9, wherein removing the Ge-doped region in the third portion of the fin structure comprises leaving a portion of the Ge-doped region covered by the second masking structure un-etched.

16. The method of claim 9, wherein growing the epitaxial stack comprises interposing un-etched portions of the Ge-doped region in the third portion of the fin structure between the epitaxial stack and the isolation region.

17. A method, comprising:
- forming an isolation region adjacent to a semiconductor layer;
- forming a gate structure on the semiconductor layer;
- forming a germanium-doped (Ge-doped) region in the semiconductor layer between the gate structure and the isolation region;
- etching a first portion of the Ge-doped region in the semiconductor layer to form an opening, wherein a second portion of the Ge-doped region remains between the opening and the isolation region; and
- forming an epitaxial stack in the opening abutting the second portion of the Ge-doped region in the semiconductor layer.

18. The method of claim 17, wherein etching the first portion of the Ge-doped region in the semiconductor layer to form the opening comprises etching a portion of the semiconductor layer below the Ge-doped region.

19. The method of claim 17, wherein forming the Ge-doped region comprises forming the Ge-doped region spaced apart from the gate structure.

20. The method of claim 17, wherein forming the epitaxial stack comprises forming one or more silicon-germanium (Si-Ge) layers in contact with the second portion of the Ge-doped region in the semiconductor layer.

* * * * *